United States Patent
Akiyama

(10) Patent No.: US 12,349,487 B2
(45) Date of Patent: Jul. 1, 2025

(54) SOLID-STATE IMAGE PICKUP DEVICE AND ELECTRONIC APPARATUS

(71) Applicant: SONY SEMICONDUCTOR SOLUTIONS CORPORATION, Kanagawa (JP)

(72) Inventor: Kentaro Akiyama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 369 days.

(21) Appl. No.: 17/756,769

(22) PCT Filed: Nov. 18, 2020

(86) PCT No.: PCT/JP2020/043090
§ 371 (c)(1),
(2) Date: Jun. 2, 2022

(87) PCT Pub. No.: WO2021/117448
PCT Pub. Date: Jun. 17, 2021

(65) Prior Publication Data
US 2023/0013149 A1 Jan. 19, 2023

(30) Foreign Application Priority Data
Dec. 12, 2019 (JP) ................. 2019-224585

(51) Int. Cl.
H01L 27/146 (2006.01)
H10F 39/00 (2025.01)

(52) U.S. Cl.
CPC ..... H10F 39/8037 (2025.01); H10F 39/8063 (2025.01)

(58) Field of Classification Search
CPC ..... H01L 27/14; H01L 27/144; H01L 27/146; H01L 27/14601; H01L 27/14603;
(Continued)

(56) References Cited

U.S. PATENT DOCUMENTS

| | | | | |
|---|---|---|---|---|
| 11,153,515 B2* | 10/2021 | Sukegawa | ......... | H01L 27/14645 |
| 11,985,443 B2* | 5/2024 | Gocho | ............. | H01L 27/14614 |
| 2012/0248544 A1* | 10/2012 | Yokoyama | .......... | H01L 23/5226 |
| | | | | 438/455 |
| 2016/0204153 A1 | 7/2016 | Tayanaka | | |
| 2017/0345854 A1 | 11/2017 | Kwon | | |
| 2018/0033809 A1 | 2/2018 | Tayanaka et al. | | |
| 2018/0122849 A1* | 5/2018 | Abe | .................. | H01L 27/14687 |

(Continued)

FOREIGN PATENT DOCUMENTS

CN 105474394 A 4/2016
JP 2013-098446 A 5/2013
(Continued)

OTHER PUBLICATIONS

International Search Report and Written Opinion of PCT Application No. PCT/JP2020/043090, issued on Feb. 16, 2021, 08 pages of ISRWO.

*Primary Examiner* — John R Lee
(74) *Attorney, Agent, or Firm* — CHIP LAW GROUP

(57) ABSTRACT

Provided is a solid-state image pickup device that includes a first substrate that is a substrate other than a {100} substrate, a photoelectric conversion unit that is provided in the first substrate, a lens that is provided above the first substrate, one or more substrates that are provided below the first substrate and have a crystal plane different from a crystal plane of the first substrate, and a transistor that is provided on an upper surface or a lower surface of one of the one or more substrates and is included in a source follower circuit.

20 Claims, 19 Drawing Sheets

(58) Field of Classification Search
CPC ......... H01L 27/14605; H01L 27/14607; H01L 27/14609; H01L 27/1461; H01L 27/14612; H01L 27/14614; H01L 27/14616; H01L 27/1462; H01L 27/14621; H01L 27/14623; H01L 27/14625; H01L 27/14627; H01L 27/14629; H01L 27/1463; H01L 27/14632; H01L 27/14634; H01L 27/14636; H01L 27/1464; H01L 27/14641; H01L 27/14643; H01L 27/14645; H01L 23/52; H01L 23/522; H01L 21/3205; H01L 21/768; H10F 39/00; H10F 39/10; H10F 39/103; H10F 39/107; H10F 39/12; H10F 39/18; H10F 39/80; H10F 39/803; H10F 39/8033; H10F 39/8037; H10F 39/805; H10F 39/8057; H10F 39/806; H10F 39/8063

See application file for complete search history.

(56) References Cited

U.S. PATENT DOCUMENTS

| | | | |
|---|---|---|---|
| 2019/0363129 | A1 | 11/2019 | Yokoyama et al. |
| 2021/0225911 | A1* | 7/2021 | Matsumura .......... H04N 25/778 |
| 2021/0400224 | A1* | 12/2021 | Gocho ................ H04N 25/778 |
| 2022/0159208 | A1* | 5/2022 | Machida ................ H04N 25/75 |
| 2022/0392936 | A1* | 12/2022 | Fukui ................ H01L 27/14685 |
| 2023/0013149 | A1* | 1/2023 | Akiyama .......... H01L 27/14627 |
| 2024/0267654 | A1* | 8/2024 | Gocho ............. H01L 27/14641 |

FOREIGN PATENT DOCUMENTS

| | | |
|---|---|---|
| JP | 2014-239147 A | 12/2014 |
| JP | 2015-046477 A | 3/2015 |
| JP | 2016-092738 A | 5/2016 |
| JP | 2018-117102 A | 7/2018 |
| TW | 201351629 A | 12/2013 |
| TW | 201541621 A | 11/2015 |
| WO | 2016/136486 A1 | 9/2016 |

* cited by examiner

Fig. 18

| ETCHING ORIENTATION | ELEMENT FORMING SURFACE | | | | | | | |
|---|---|---|---|---|---|---|---|---|
| | (111) | (-111) | (1-11) | (11-1) | (-1-11) | (-11-1) | (1-1-1) | (-1-1-1) |
| [110] | | O | | | | | O | |
| [101] | | O | | | | | O | |
| [011] | | | O | | O | | | |
| [-110] | O | | | | O | O | | |
| [1-10] | O | | | O | O | | | |
| [-101] | O | | | | O | | | O |
| [10-1] | O | | | O | | | | O |
| [0-11] | O | | | | | O | | O |
| [01-1] | | | | O | | O | | O |
| [-1-10] | | O | | | | | O | O |
| [-10-1] | | O | | O | | | | O |
| [0-1-1] | | | O | | O | | | O |

SOLID-STATE IMAGE PICKUP DEVICE AND ELECTRONIC APPARATUS

CROSS REFERENCE TO RELATED APPLICATIONS

This application is a U.S. National Phase of International Patent Application No. PCT/JP2020/043090 filed on Nov. 18, 2020, which claims priority benefit of Japanese Patent Application No. JP 2019-224585 filed in the Japan Patent Office on Dec. 12, 2019. Each of the above-referenced applications is hereby incorporated herein by reference in its entirety.

TECHNICAL FIELD

The present disclosure relates to a solid-state image pickup device and an electronic apparatus.

BACKGROUND ART

A solid-state image pickup device may be manufactured using a substrate other than a {100} substrate. For example, in the formation of a vertical trench and a horizontal trench in a semiconductor substrate, using a {111} substrate as the semiconductor substrate makes it easy to form the vertical trench and the horizontal trench in the semiconductor substrate by etching.

CITATION LIST

Patent Literature

[PTL 1]
WO 2016/136486
[PTL 2]
JP 2013-98446 A

SUMMARY

Technical Problem

However, there is a problem that a circuit element to be formed on a semiconductor substrate may have poor characteristics when it is formed on a substrate other than a {100} substrate, for example, a {111} substrate.

Therefore, the present disclosure provides a solid-state image pickup device and an electronic apparatus, which are capable of using a substrate other than a {100} substrate while suppressing the problem of substrates other than the {100} substrate.

Solution to Problem

A solid-state image pickup device according to a first aspect in the present disclosure includes a first substrate that is a substrate other than a {100} substrate; a photoelectric conversion unit that is provided in the first substrate; a lens that is provided above the first substrate; one or more substrates that are provided below the first substrate and have a crystal plane different from a crystal plane of the first substrate; and a transistor that is provided on an upper surface or a lower surface of one of the one or more substrates and is included in a source follower circuit. This makes it possible to use a {111} substrate as the first substrate while suppressing the problem of the {111} substrate that the characteristics of the source follower circuit deteriorate, for example.

Further, in this first aspect, the first substrate may include a vertical trench extending in a vertical direction and a horizontal trench extending in a horizontal direction and connected to the vertical trench, and the horizontal trench may include a light-shielding film that is provided between the photoelectric conversion unit and a charge holding unit in the first substrate. This makes it possible to enjoy the advantage of the {111} substrate, for example, which makes it easy to form a vertical trench and a horizontal trench.

Further, in this first aspect, the light-shielding film may be provided in the horizontal trench and the vertical trench. This makes it possible to embed the light-shielding film in the horizontal trench via the vertical trench, for example.

Further, in this first aspect, the light-shielding film may be provided in the horizontal trench and the vertical trench via an element separation insulating film. This makes it possible to embed the element separation insulating film in the horizontal trench via the vertical trench, for example.

Further, in this first aspect, the first substrate may be a {111} substrate, and the substrate provided with the transistor may be a {100} substrate or a {110} substrate. This makes it possible to form the transistor of the source follower circuit on the {100} substrate or the {110} substrate.

Further, the solid-state image pickup device in this first aspect may further include a capacitor that is provided in the same layer as the transistor. This makes it possible to form the transistor of the source follower circuit and the capacitor with the same material, for example.

Further, the solid-state image pickup device in this first aspect may further include a logic circuit that is provided in the same layer as the transistor. This makes it possible to form the transistor of the source follower circuit and the logic circuit with the same material, for example.

Further, in this first aspect, the transistor may be an amplification transistor electrically connected to a floating diffusion unit in the first substrate. This makes it possible to use a {111} substrate as the first substrate while suppressing the problem of the {111} substrate that the characteristics of the amplification transistor deteriorate, for example.

Further, in this first aspect, the transistor may include a gate insulating film and a gate electrode which are provided in this order on an upper surface or a lower surface of one of the one or more substrates. This makes it possible to form a capacitor or a logic circuit with the same material as the gate insulating film and the gate electrode of the amplification transistor, for example.

Further, the solid-state image pickup device in this first aspect may further include a transfer transistor that is provided on a lower surface of the first substrate. This makes it possible to form the source follower circuit on a substrate other than a {111} substrate while forming the transfer transistor on the {111} substrate, for example.

Further, in this first aspect, the one or more substrates may include a second substrate that is provided below the first substrate and is provided with a capacitor on a lower surface thereof, and the transistor may be provided on the lower surface of the second substrate. This makes it possible to form the transistor of the source follower circuit on the substrate for the capacitor.

Further, in this first aspect, the one or more substrates may further include a third substrate that is provided below the second substrate and is provided with a logic circuit on an upper surface thereof. This makes it possible to form the transistor of the source follower circuit on the substrate other than that for the logic circuit.

Further, in this first aspect, the one or more substrates may include a third substrate that is provided below the first substrate and is provided with a capacitor and a logic circuit on an upper surface thereof, and the transistor may be provided on the upper surface of the third substrate. This makes it possible to form the transistor of the source follower circuit on the substrate for the capacitor and the logic circuit.

Further, in this first aspect, the one or more substrates may include a second substrate that is provided below the first substrate and is provided with a capacitor and a logic circuit on a lower surface thereof, and the transistor may be provided on the lower surface of the second substrate. This makes it possible to form the transistor of the source follower circuit on the substrate for the capacitor and the logic circuit.

Further, in this first aspect, the one or more substrates may further include a third substrate that is provided below the second substrate. This makes it possible to form the transistor of the source follower circuit on the substrate other than the support substrate, for example.

Further, in this first aspect, the one or more substrates may include the second substrate that is provided below the first substrate and is provided with a capacitor on a lower surface thereof, and the transistor may be provided on the lower surface of the second substrate. This makes it possible to form the transistor of the source follower circuit on the substrate for the capacitor.

Further, in this first aspect, the one or more substrates may further include a third substrate that is provided below the second substrate. This makes it possible to form the transistor of the source follower circuit on the substrate other than the support substrate, for example.

Further, the solid-state image pickup device in this first aspect may further include a fourth substrate that is provided above the first substrate and is provided with a logic circuit on an upper surface or a lower surface thereof. This makes it possible to form the logic circuit on the substrate other than the support substrate, for example.

Further, in this first aspect, the fourth substrate may be provided above the first substrate via solder. This makes it possible to electrically connect the logic circuit provided on the fourth substrate to pixels provided on the first substrate, for example.

An electronic apparatus according to a second aspect in the present disclosure includes an image pickup device. The image pickup device includes a first substrate that is a substrate other than a {100} substrate; a photoelectric conversion unit that is provided in the first substrate; a lens that is provided above the first substrate; one or more substrates that are provided below the first substrate and have a crystal plane different from a crystal plane of the first substrate; and a transistor that is provided on an upper surface or a lower surface of one of the one or more substrates and is included in a source follower circuit. This makes it possible to use a {111} substrate as the first substrate while suppressing the problem of the {111} substrate that the characteristics of the source follower circuit deteriorate, for example.

BRIEF DESCRIPTION OF DRAWINGS

FIG. 18 is a table for explaining the etching of a Si {111} substrate in the present disclosure.

DESCRIPTION OF EMBODIMENTS

Embodiments of the present invention will be described below with reference to the drawings.

First Embodiment

Figure 1:
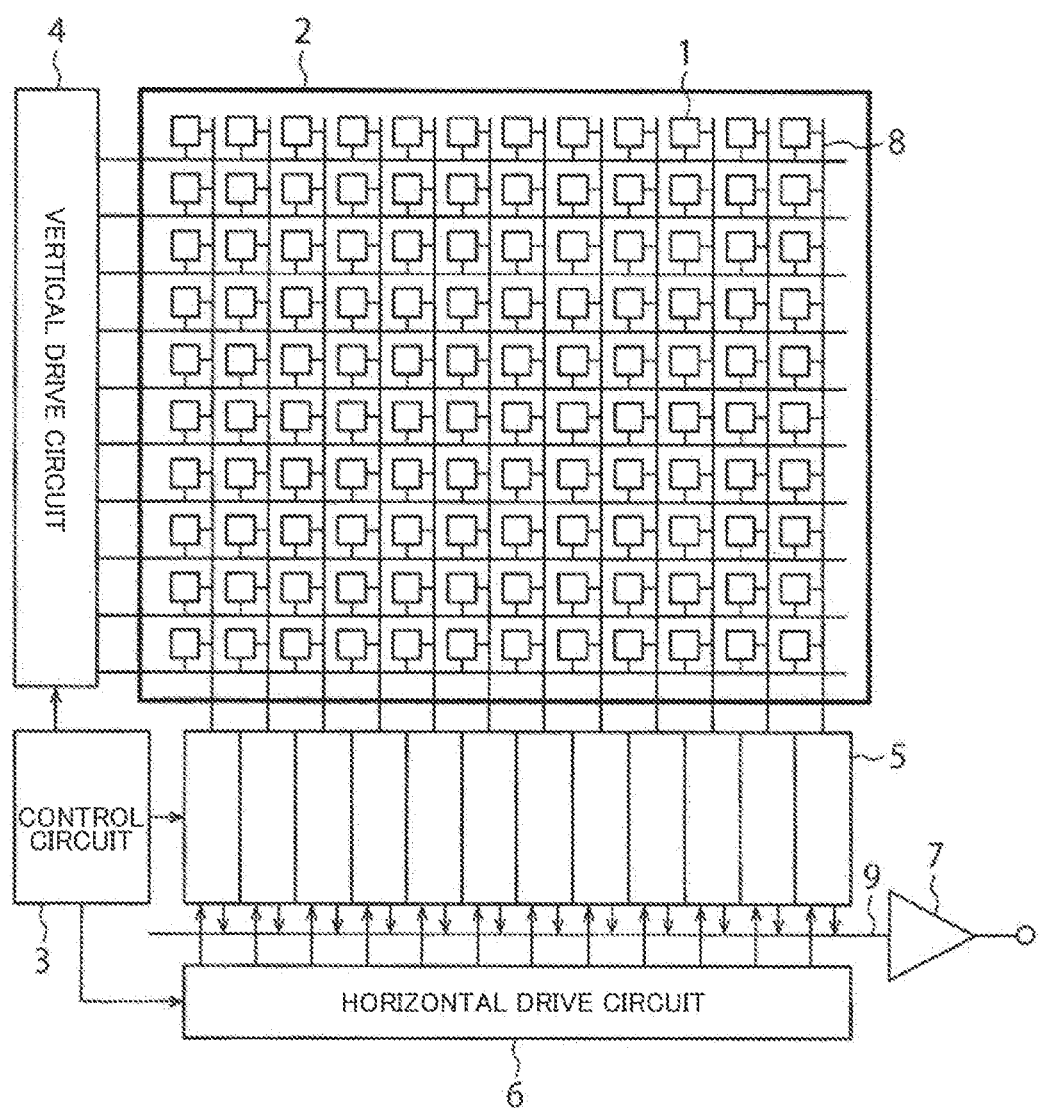
FIG. 1 is a block diagram illustrating a configuration of a solid-state image pickup device according to a first embodiment.

FIG. 1 is a block diagram illustrating a configuration of a solid-state image pickup device according to a first embodiment.

The solid-state image pickup device of FIG. 1 is a CMOS (Complementary Metal Oxide Semiconductor) type solid-state image pickup device, and includes a pixel array region 2 with a plurality of pixels 1, a control circuit 3, a vertical drive circuit 4, a plurality of column signal processing circuits 5, a horizontal drive circuit 6, an output circuit 7, a plurality of vertical signal lines 8, and a horizontal signal line 9.

Each pixel 1 includes a photodiode that functions as a photoelectric conversion unit, and a plurality of pixel transistors. Examples of the pixel transistors include MOS transistors, for example, a transfer transistor, a reset transistor, an amplification transistor, and a selection transistor. Each pixel 1 of the present embodiment includes five MOS transistors, TRZ, TRY, TRX, TRG, and OFG, which are transfer transistors.

The pixel array region 2 has the plurality of pixels 1 arranged in a two-dimensional array. The pixel array region 2 has effective pixel regions for receiving light, performing photoelectric conversion, amplifying a signal charge generated by the photoelectric conversion, and outputting the resulting signal, and black reference pixel regions (not illustrated) for outputting optical black which is a reference for the black level. Generally, each black reference pixel region is disposed on the peripheral of the corresponding effective pixel region.

The control circuit 3 generates various types of signals that serve as reference for the operation of the vertical drive circuit 4, the column signal processing circuits 5, the horizontal drive circuit 6, and the like, based on the vertical sync signal, the horizontal sync signal, and the master clock. The signals generated by the control circuit 3 include, for example, a clock signal and a control signal, and are input to the vertical drive circuit 4, the column signal processing circuits 5, the horizontal drive circuit 6, and the like.

The vertical drive circuit 4 includes, for example, a shift register, and sequentially and selectively scans the pixels 1 in the pixel array region 2 row by row in the vertical direction. The vertical drive circuit 4 further supplies a pixel signal based on the signal charge generated in each pixel 1 according to the amount of light received to the column signal processing circuit 5 through the corresponding vertical signal line 8.

The column signal processing circuit 5 is disposed, for example, for each column of pixels 1 in the pixel array region 2, so that the column signal processing circuits 5 perform signal processing on the signals output from the pixels 1 for one row based on the signal from the black reference pixel regions. Examples of this signal processing include noise reduction and signal amplification. Horizontal selection switches (not illustrated) are provided between the output stages of the column signal processing circuits 5 and the horizontal signal line 9.

The horizontal drive circuit 6 includes, for example, a shift register, and sequentially outputs horizontal scanning pulses to select each of the column signal processing circuits 5 in a sequential order, thereby causing each of the column signal processing circuits 5 to output a pixel signal to the horizontal signal line 9.

The output circuit 7 performs signal processing on the signal sequentially supplied from each of the column signal processing circuits 5 through the horizontal signal line 9, and outputs the signal on which the signal processing has been performed.

Figure 2:
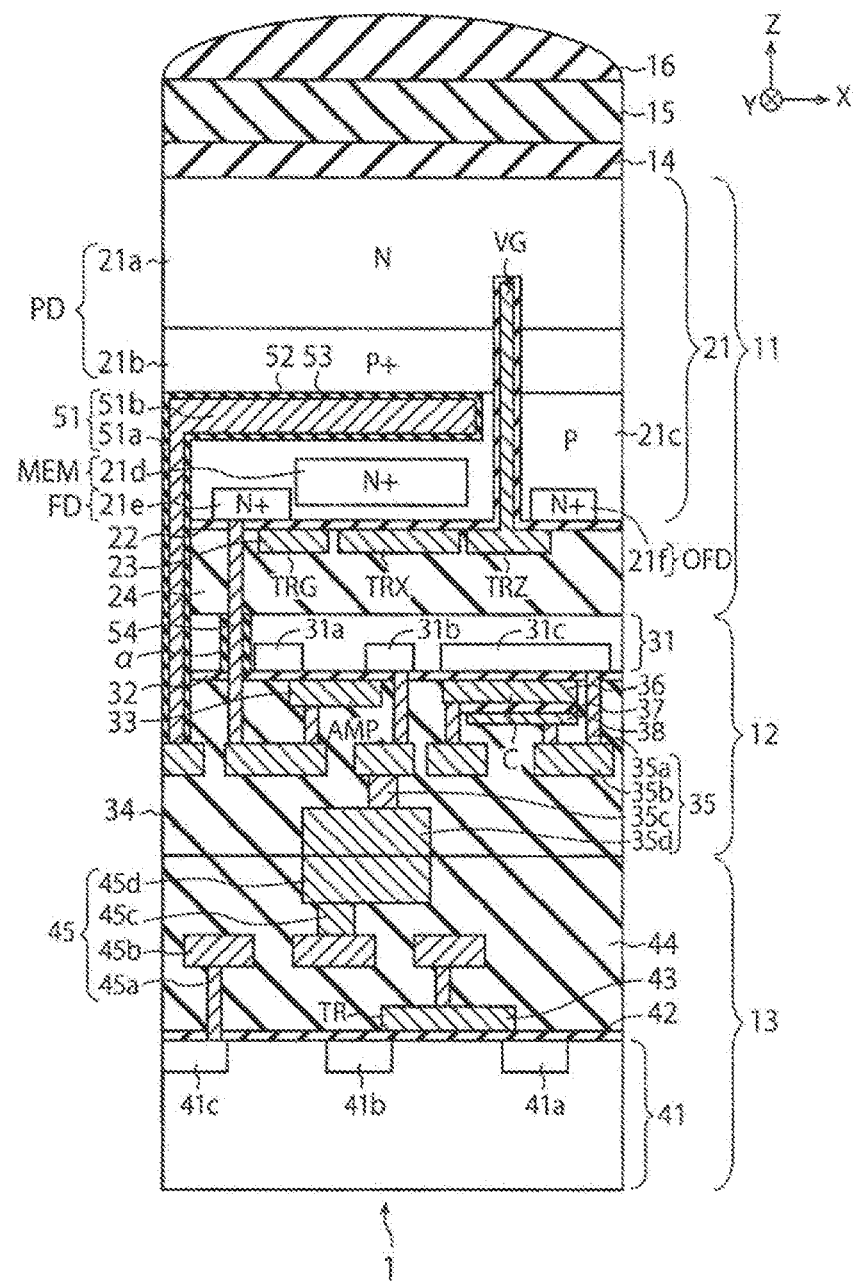
FIG. 2 is a cross-sectional view illustrating a structure of the solid-state image pickup device according to the first embodiment.

FIG. 2 is a cross-sectional view illustrating a structure of the solid-state image pickup device according to the first embodiment. FIG. 2 illustrates a vertical cross section of one pixel 1 included in the pixel array region 2 of FIG. 1.

FIG. 2 illustrates the X-axis, Y-axis, and Z-axis that are perpendicular to each other. The X and Y directions correspond to the horizontal directions (horizontal directions), and the Z direction corresponds to the vertical direction (vertical direction). Further, the +Z direction corresponds to the upward direction, and the −Z direction corresponds to the downward direction. The −Z direction may or may not exactly coincide with the direction of gravity.

The solid-state image pickup device of the present embodiment includes a photodiode PD, a memory unit MEM, a floating diffusion unit FD, another diffusion unit OFD, a first transfer transistor TRZ, a second transfer transistor TRY (not illustrated), a third transfer transistor TRX, a fourth transfer transistor TRG, a fifth transfer transistor (discharge transistor) OFG (not illustrated), a reset transistor RST (not illustrated), an amplification transistor AMP, a selection transistor SEL (not illustrated), a transistor TR included in a logic circuit, and a capacitor C.

The solid-state image pickup device of the present embodiment further includes an upper substrate 11, an intermediate substrate 12, a lower substrate 13, a planarization film 14, a color filter layer 15, and an on-chip lens 16.

The upper substrate 11 includes a substrate 21, an insulating film 22, a gate electrode 23, and an interlayer insulating film 24. The substrate 21 has an N-type semiconductor region 21a, a P+-type semiconductor region 21b, a P-type semiconductor region 21c, an N+-type semiconductor region 21d, an N+-type semiconductor region 21e, and an N+-type semiconductor region 21f. The substrate 21 is an example of a first substrate in the present disclosure. The upper substrate 11 of the present embodiment is a sensor substrate that functions as an image sensor. Reference character VG indicates a vertical gate electrode included in the gate electrode 23 of the first transfer transistor TRZ.

The intermediate substrate 12 includes a substrate 31, an insulating film 32, a gate electrode 33, an interlayer insulating film 34, a multilayer wiring structure 35, an upper electrode 36, an insulating film 37, and a lower electrode 38. The substrate 31 includes diffusion layers 31a, 31b, and 31c. The substrate 31 is an example of a second substrate in the present disclosure. The multilayer wiring structure 35 includes a plurality of contact plugs 35a, a wiring layer 35b, a via plug 35c, and a metal pad 35d. The intermediate substrate 12 of the present embodiment is a capacitor substrate with the capacitor C.

The lower substrate 13 includes a substrate 41, an insulating film 42, a gate electrode 43, an interlayer insulating film 44, and a multilayer wiring structure 45. The substrate 41 includes diffusion layers 41a, 41b, and 41c. The substrate 41 is an example of a third substrate in the present disclosure. The multilayer wiring structure 45 includes a plurality of contact plugs 45a, a wiring layer 45b, a via plug 45c, and a metal pad 45d. The lower substrate 13 of the present embodiment is a logic substrate with a logic circuit.

The solid-state image pickup device of the present embodiment further includes a trench 51, an element separation insulating film 52, a light-shielding film 53, and a plug 54. The trench 51 includes a vertical trench 51a and a horizontal trench 51b.

The substrate 21 is, for example, a semiconductor substrate such as a silicon (Si) substrate. The substrate 21 of the present embodiment is a 11111 substrate. In FIG. 2, the upper surface of the substrate 21 (the surface in the +Z direction) is the back surface of the substrate 21, and the lower surface of the substrate 21 (the surface in the −Z direction) is the front surface of the substrate 21. The solid-state image pickup device of the present embodiment is a back-illuminated type, and thus the upper surface of the substrate 21 is the light incident surface of the substrate 21.

The substrate 21 may be, for example, a substrate including a semiconductor substrate and a semiconductor layer formed on the lower surface of the semiconductor substrate. The {111} substrate is an example of a substrate other than the {100} substrate in the present disclosure.

The substrate 21 has an impurity semiconductor region such as the N-type semiconductor region 21a. The P+-type semiconductor region 21b is provided under the N-type semiconductor region 21a. The P-type semiconductor region 21c is provided under the P+-type semiconductor region 21b. The N+-type semiconductor region 21d is provided in the P-type semiconductor region 21c and is located in the vicinity of the lower surface of the substrate 21. The N+-type semiconductor region 21e and the N+-type semiconductor region 21f are provided under the P-type semiconductor region 21c, and are exposed on the lower surface of the substrate 21.

The photodiode PD has the N-type semiconductor region 21a and the P+-type semiconductor region 21b which form a PN junction, and functions as a photoelectric conversion unit that converts received light into an electric charge to generate a signal charge. The photodiode PD is provided in the substrate 21 for each pixel 1.

The memory unit MEM has the N+-type semiconductor region 21d and functions as a charge holding unit that holds the signal charge generated by the photodiode PD. The signal charge is stored in the N+-type semiconductor region 21d.

The floating diffusion unit FD has the N+-type semiconductor region 21e and functions as a charge-voltage conversion unit that converts the signal charge transferred from the memory unit MEM into a voltage signal and outputs the voltage signal. On the other hand, the diffusion unit OFD has the N+-type semiconductor region 21f.

The solid-state image pickup device of the present embodiment employs a global shutter (GS) method, and includes the memory unit MEM in addition to the photodiode PD and the floating diffusion unit FD. Thus, the signal charge from the photodiode PD can be supplied to the floating diffusion unit FD via the memory unit MEM. In addition, the solid-state image pickup device of the present embodiment employs a laminated structure in which the memory unit MEM is disposed in the vertical direction of the photodiode PD instead of the horizontal direction. This makes it possible to reduce the area of the integrated circuit of the solid-state image pickup device.

The insulating film 22 is provided on the lower surface of the substrate 21. The insulating film 22 is, for example, a silicon oxide film. The insulating film 22 functions as the gate insulating film of the first transfer transistor TRZ, the second transfer transistor TRY (not illustrated), the third transfer transistor TRX, the fourth transfer transistor TRG, and the fifth transfer transistor OFG (not illustrated).

The gate electrode 23 is provided on the lower surface of the insulating film 22. The gate electrode 23 is, for example, a semiconductor layer such as a silicon (Si) layer, or a metal layer such as a tungsten (W) layer, an aluminum (Al) layer, a Cu (copper) layer, or a metal silicide layer. The gate electrode 23 is included in the first transfer transistor TRZ, the second transfer transistor TRY (not illustrated), the third transfer transistor TRX, the fourth transfer transistor TRG, and the fifth transfer transistor OFG (not illustrated). The gate electrode 23 of the first transfer transistor TRZ includes the vertical gate electrode VG provided via the insulating film 22 in the P-type semiconductor region 21c, the P+-type semiconductor region 21b, and an N-type semiconductor region 21Aa of the substrate 21.

The first transfer transistor TRZ transfers the signal charge from the photodiode PD to the memory unit MEM. The second transfer transistor TRY and the third transfer transistor TRX transfer the signal charge in the memory unit MEM. The fourth transfer transistor TRG transfers the signal charge from the memory unit MEM to the floating diffusion unit FD. The fifth transfer transistor OFG is provided between the photodiode PD and the diffusion unit OFD, and is used to initialize the photodiode PD, that is, to reset the potential of the photodiode PD to a power supply potential (VDD potential). It is to be noted that a semiconductor device of the present embodiment may include only the third transfer transistor TRX of the second transfer transistor TRY and the third transfer transistor TRX. The semiconductor device provided with TRY and TRX has better signal charge transfer performance, but the semiconductor device provided with only TRX simplifies the structure of the semiconductor device.

The interlayer insulating film 24 is formed on the lower surface of the substrate 21 so as to cover the insulating film 22, the gate electrode 23, and the like. The interlayer insulating film 24 is, for example, a silicon oxide film or a laminated film including a silicon oxide film.

The substrate 31 is provided below the substrate 21 via the interlayer insulating film 24, and is in contact with the lower surface of the interlayer insulating film 24. The substrate 31 is, for example, a semiconductor substrate such as a silicon substrate. The substrate 31 of the present embodiment has a crystal plane different from the crystal plane of the substrate 21. Specifically, the substrate 31 of the present embodiment is a semiconductor substrate other than a {111} substrate, for example, a {100} substrate. The substrate 31 may be a {110} substrate. In FIG. 2, the upper surface of the substrate 31 is the back surface of the substrate 31, and the lower surface of the substrate 31 is the front surface of the substrate 31. The substrate 31 may be, for example, a substrate including a semiconductor substrate and a semiconductor layer formed on the lower surface of the semiconductor substrate.

The insulating film 32 is provided on the lower surface of the substrate 31. The insulating film 32 is, for example, a silicon oxide film. The insulating film 32 functions as the gate insulating film of the reset transistor RST (not illustrated), the amplification transistor AMP, and the selection transistor SEL (not illustrated), and as the upper dielectric film of the capacitor C.

The gate electrode 33 is provided on the lower surface of the insulating film 32. The gate electrode 33 is, for example, a semiconductor layer such as a silicon layer, or a metal layer such as a tungsten layer, an aluminum layer, a copper layer, or a metal silicide layer. The gate electrode 33 is included in the reset transistor RST (not illustrated), the amplification transistor AMP, and the selection transistor SEL (not illustrated).

The reset transistor RST is used to initialize the memory unit MEM and the floating diffusion unit FD, that is, to reset the potentials of the memory unit MEM and the floating diffusion unit FD to the power supply potential (VDD potential).

The amplification transistor AMP functions as an input unit of a source follower circuit that reads a voltage signal from the floating diffusion unit FD. The diffusion layers 31a and 31b in the substrate 31 function as the drain region and the source region of the amplification transistor AMP. The gate electrode 33 of the amplification transistor AMP is electrically connected to the floating diffusion unit FD. The diffusion layer 31b is electrically connected to the logic circuit(s) in the lower substrate 13. The source region of the amplification transistor AMP of the present embodiment is electrically connected to the vertical signal line 8 (FIG. 1) via the selection transistor SEL, so that the source follower circuit is made up of the amplification transistor AMP and a constant current source that is electrically connected to the vertical signal line 8. The amplification transistor AMP is an example of a transistor included in the source follower circuit in the present disclosure.

The selection transistor SEL is used to select the corresponding pixel 1. When the selection transistor SEL is turned on, the corresponding pixel 1 changes to a selection state, and the pixel signal from the amplification transistor AMP is read out by the column signal processing circuit 5 (FIG. 1) via the vertical signal line 8.

The upper electrode 36, the insulating film 37, and the lower electrode 38 are provided on the lower surface of the insulating film 32 in this order. The upper electrode 36 is, for example, a semiconductor layer such as a silicon layer, or a metal layer such as a tungsten layer, an aluminum layer, a copper layer, or a metal silicide layer. The gate electrode 33 and the upper electrode 36 of the present embodiment are included in the same electrode layer, and are formed by forming that electrode layer on the surface of the insulating film 32 and processing the electrode layer by etching. The insulating film 37 is, for example, a silicon oxide film, and functions as the lower dielectric film of the capacitor C. The lower electrode 38 is, for example, a semiconductor layer such as a silicon layer, or a metal layer such as a tungsten layer, an aluminum layer, a copper layer, or a metal silicide layer. It is to be noted that the upper electrode 36, the insulating film 37, and the lower electrode 38 may be provided below the substrate 31 at positions different from those illustrated in FIG. 2.

The capacitor C includes three electrodes, the diffusion layer 31c, the upper electrode 36, and the lower electrode 38, and two dielectric films, the insulating film 32 and the insulating film 37, sandwiched between these electrodes. In this way, the capacitor C of the present embodiment is provided on the lower surface of the substrate 31, and the amplification transistor AMP of the present embodiment is also provided on the lower surface of this substrate 31. The amplification transistor AMP and the capacitor C of the present embodiment are provided in the same layer. Specifically, the gate insulating film (insulating film 32) and the gate electrode 33 of the amplification transistor AMP are provided in the same layer as the upper dielectric film (insulating film 32) and the upper electrode 36 of the capacitor C, respectively. The capacitor C of the present embodiment is used, for example, as the pixel internal capacitance of the corresponding pixel 1.

The interlayer insulating film 34 is formed on the lower surface of the substrate 31 so as to cover the insulating film 32, the gate electrode 33, the upper electrode 36, the insulating film 37, the lower electrode 38, and the like. The interlayer insulating film 34 is, for example, a silicon oxide film or a laminated film including a silicon oxide film.

The multilayer wiring structure 35 is provided in the interlayer insulating film 34, and includes the plurality of contact plugs 35a, the wiring layer 35b, the via plug 35c, and the metal pad 35d. The contact plugs 35a are provided on the lower surfaces of the diffusion layers 31a, 31b, and 31c, the gate electrode 33, the upper electrode 36, the lower electrode 38, and the like. The wiring layer 35b includes a plurality of lines provided on these contact plugs 35a. The via plug 35c is provided under the wiring layer 35b. The metal pad 35d is provided under the via plug 35c and is joined to the metal pad 45d of the lower substrate 13. As a result, the intermediate substrate 12 and the lower substrate 13 are electrically connected to each other via these metal pads 35d and 45d.

The substrate 41 is provided below the substrate 31 via the interlayer insulating films 34 and 44. The substrate 41 is, for example, a semiconductor substrate such as a silicon substrate. The substrate 41 of the present embodiment has a crystal plane different from the crystal plane of the substrate 21. Specifically, the substrate 41 of the present embodiment is a semiconductor substrate other than a {111} substrate, for example, a {100} substrate. The substrate 41 may be a {110} substrate. In FIG. 2, the upper surface of the substrate 41 is the front surface of the substrate 41, and the lower surface of the substrate 41 is the back surface of the substrate 41. The substrate 41 may be, for example, a substrate including a semiconductor substrate and a semiconductor layer formed on the lower surface of the semiconductor substrate. The substrate 41 of the present embodiment functions as a support substrate that supports the substrate 21 and the substrate 31.

The insulating film 42 is provided on the upper surface of the substrate 41. The insulating film 42 is, for example, a silicon oxide film. The insulating film 42 functions as the gate insulating film of the transistor TR included in the logic circuit.

The gate electrode 43 is provided on the upper surface of the insulating film 42. The gate electrode 43 is, for example, a semiconductor layer such as a silicon layer, or a metal layer such as a tungsten layer, an aluminum layer, a copper layer, or a metal silicide layer. The gate electrode 43 is included in the transistor TR included in the logic circuit.

The lower substrate 13 of the present embodiment includes logic circuit(s) provided on the upper surface of the substrate 41, and the transistor TR illustrated in FIG. 2 constitutes this logic circuit. This logic circuit functions to control various types of operations of the solid-state image pickup device, for example. The diffusion layers 41a and 41b in the substrate 41 function as the drain region and the source region of the transistor TR.

The interlayer insulating film 44 is formed on the upper surface of the substrate 41 so as to cover the insulating film 42, the gate electrode 43, and the like, and is in contact with the lower surface of the interlayer insulating film 34. The interlayer insulating film 44 is, for example, a silicon oxide film or a laminated film including a silicon oxide film.

The multilayer wiring structure 45 is provided in the interlayer insulating film 44, and includes the plurality of contact plugs 45a, the wiring layer 45b, the via plug 45c, and the metal pad 45d. The contact plugs 45a are provided on the upper surface of the diffusion layers 41a, 41b, and 41c, the gate electrode 43, and the like. The wiring layer 45b includes a plurality of lines provided on these contact plugs 45a. The via plug 45c is provided on the wiring layer 45b. The metal pad 45d is provided on the via plug 45c and is joined to the metal pad 35d of the intermediate substrate 12. As a result, the intermediate substrate 12 and the lower substrate 13 are electrically connected to each other via these metal pads 35d and 45d.

The trench 51 includes the vertical trench 51a provided in the substrate 21 and extending in the vertical direction (Z direction), and the horizontal trench 51b provided in the substrate 21 and extending in the horizontal direction (X direction). The vertical trench 51a extends in the vertical direction from the upper surface of the wiring layer 35b through the lower surface of the substrate 21, and the horizontal trench 51b is connected to the vertical trench 51a and extends in the horizontal direction from the vertical trench 51a. The vertical trench 51a has a plate-like shape that extends in the YZ plane. On the other hand, the horizontal trench 51b has a plate-like shape that expands in the XY plane, and is provided between the photodiode PD and the memory unit MEM and between the photodiode PD and the floating diffusion unit FD.

The element separation insulating film 52 is embedded in the trench 51 and is formed on the side surfaces, the upper surface, and the lower surface of the trench 52. The element separation insulating film 52 functions as a film for electrically separating the pixels 1 from each other. The element separation insulating film 13 is, for example, a silicon oxide film. The element separation insulating film 52 of the present embodiment is formed in both the vertical trench 51a and the horizontal trench 41b.

As with the element separation insulating film 52, the light-shielding film 53 is embedded in the trench 51, and is formed on the side surfaces, the upper surface, and the lower surface of the trench 51 via the element separation insulating film 52. The light-shielding film 53 shields light coming from the upper surface of the substrate 21 and functions as a film for optically separating the photodiode PD and the memory unit MEM from each other. The light-shielding film 53 is, for example, a metal layer such as a tungsten layer or a compound semiconductor layer having a chalcopyrite structure with a high absorptivity.

The plug 54 is provided in the upper substrate 11 and the intermediate substrate 12 so as to electrically connect the floating diffusion unit FD and a line in the wiring layer 35b. As a result, the floating diffusion unit FD and the gate electrode 33 of the amplification transistor AMP are electrically connected to each other. It is to be noted that the plug 54 is provided in the substrate 31 via an insulating film a.

The planarization film 14 is formed on the entire surface of the substrate 21 so as to cover the upper surface of the substrate 21, whereby the face on the upper surface of the substrate 21 is flat. The planarization film 14 is, for example, an organic film such as a resin film. The planarization film 14 may be an insulating film other than an organic film, and the upper surface of this insulating film may be planarized by CMP (Chemical Mechanical Polishing).

The color filter layer 15 is formed on the planarization film 14 for each pixel 1. For example, the color filter layer 15 for red (R), green (G), or blue (B) is disposed above the photodiode PD of the pixel 1 in red, green, or blue. The color filter layer 15 may be disposed, as a color filter layer 15 for infrared light, above the photodiode PD of the pixel 1 for infrared light. The color filter layer 15 has a property of being able to transmit light with a predetermined wavelength, and the light transmitted through the color filter layer 15 is incident on the photodiode PD via the planarization film 14.

The on-chip lens 16 is formed on the color filter layer 15 for each pixel 1. The on-chip lens 16 has a property of condensing the incident light, and the light collected by the on-chip lens 16 is incident on the photodiode PD via the color filter layer 15 and the planarization film 14.

As described above, the substrate 21 of the present embodiment is not a {100} substrate but a {111} substrate. In this case, there is a problem that a circuit element of the solid-state image pickup device may have poor characteristics when it is formed on the {111} substrate. An example of such a circuit element is the amplification transistor AMP included in the source follower circuit. Therefore, in the present embodiment, such a circuit element is formed not on the substrate 21, which is the {111} substrate, but on the substrate 31, which is the {100} substrate. As a result, according to the present embodiment, it is possible to use a {111} substrate while suppressing the problem of the {111} substrate that the characteristics of such a circuit element deteriorate. A specific example will be described below in detail.

As described above, the solid-state image pickup device of the present embodiment employs a global shutter (GS) method, and includes the memory unit MEM in addition to the photodiode PD and the floating diffusion unit FD. Thus, the signal charge from the photodiode PD can be supplied to the floating diffusion unit FD via the memory unit MEM. In addition, the solid-state image pickup device of the present embodiment employs a laminated structure in which the memory unit MEM is disposed in the vertical direction of the photodiode PD instead of the horizontal direction. This makes it possible to reduce the area of the integrated circuit of the solid-state image pickup device.

When a laminated structure is employed, it is desirable that the light-shielding film 53 extending in the horizontal direction is formed between the photodiode PD and the memory unit MEM so that the photodiode PD and the memory unit MEM are optically separated from each other by the light-shielding film 53. Therefore, in the present embodiment, the vertical trench 51a is formed extending in the vertical direction in the substrate 21, and the horizontal trench 51b is formed extending in the horizontal direction from the vertical trench 51a, so that the horizontal trench 51b is formed between the photodiode FD and the memory unit MEM. Further, the light-shielding film 53 is embedded in the vertical trench 51a and the horizontal trench 51b, so that the light-shielding film 53 is formed in the horizontal trench 51b. It is to be noted that, since the vertical trench 51a of the present embodiment is formed to form an element separation portion that electrically separates the pixels 1 from each other, in the present embodiment, the light-shielding film 53 is embedded in the vertical trench 51a and the horizontal trench 51b via the element separation insulating film 52.

When the vertical trench 51a and the horizontal trench 51b are formed in the substrate 21, it is desirable that the substrate 21 is a {111} substrate. This makes it easy to form the vertical trench 51a and the horizontal trench 51b in the substrate 21 by etching. For example, when the substrate 21 is a {111} substrate, the <110> directions and the <112> directions in the substrate 21 are perpendicular to the Z direction. On the other hand, since the substrate 21 is etched by a long distance in the X direction to form the horizontal trench 51b in the substrate 21, it is desirable that the substrate 21 is easily etched in the X direction, that is, the etching rate in the X direction is high. Here, it is known that {111} substrates have a high etching rate in the <110> direction. Thus, according to the present embodiment, it is possible to easily form the horizontal trench 51b in the substrate 21 by making the X direction parallel to the <110> direction.

However, there is a problem that {111} substrates are not suitable for the interface level as compared with {100} substrates and {110} substrates. Therefore, if the amplification transistor AMP of the source follower circuit is provided on the substrate 21, which is a {111} substrate, the S/N ratio (signal to noise ratio) in the source follower circuit deteriorates.

Therefore, the amplification transistor AMP of the present embodiment is provided not on the substrate 21, which is a {111} substrate, but on the substrate 31, which is a {100} substrate. This makes it possible to suppress the deterioration of the S/N ratio in the source follower circuit. In this way, according to the present embodiment, it is possible to enjoy the advantage of the substrate {111} that the vertical trench 51a and the horizontal trench 51b are easily formed while suppressing the disadvantage of the {111} substrate that the S/N ratio in the source follower circuit deteriorates.

It is to be noted that the substrate 31 on which the amplification transistor AMP is provided may be any substrate other than a {100} substrate as long as it is a substrate other than a {111} substrate. The substrate 31 may be, for example, a {110} substrate. However, using a {100} substrate for the substrate 31 has an advantage that the cost of the substrate 31 can be suppressed. Further, the amplification transistor AMP may be provided on the substrate 41 instead of the substrate 31. In this case, the substrate 41 may be any substrate other than a {100} substrate as long as it is a substrate other than a {111} substrate. This is the same as the case of the substrate 31.

A supplementary explanation regarding the above-mentioned Si {111} substrate, <110> direction, and the like is provided below.

The Si {111} substrate referred to in the present disclosure is a substrate or wafer made of a silicon single crystal and having a crystal plane represented by {111} in the Miller index notation. The Si {111} substrate in the present disclosure also includes a substrate or wafer in the crystal orientation is deviated by several degrees, for example, a substrate or wafer deviated by several degrees from the {111} plane in the nearest [110] direction. In addition, it also includes that made of a silicon single crystal grown on a part or the entire surface of such substrates or wafers by an epitaxial method or the like.

Further, in the notation used in the present disclosure, the {111} plane is a generic term for the (111) plane, (−111) plane, (1−11) plane, (11−1) plane, (−1−11) plane, (−11−1) plane, (1−1−1) plane, and (−1−1−1) plane, which are crystal planes equivalent to one another in symmetry. Therefore, the Si {111} substrate referred to in the specification in the present disclosure may be read as, for example, the Si (1−11) substrate. As referred to herein, the minus sign is used as substitution of the bar sign for expressing the negative index in the Miller index.

Further, the <110> direction as referred to in the present disclosure is a generic term for the [110] direction, [101] direction, [011] direction, [−110] direction, [1−10] direction, [−101] direction, [10−1] direction, [0−11] direction, [01−1] direction, [−1−10] direction, [−10−1] direction, and [0−1−1] direction, which are crystal plane directions equivalent to one another in symmetry, and may be read as either. However, in the present disclosure, etching is performed in a direction orthogonal to an element forming surface and a direction further orthogonal to the direction orthogonal to the element forming surface (i.e., a direction parallel to the element forming surface).

FIG. 18 illustrates a specific combination of a plane and an orientation in which etching in the <110> direction is established on the {111} plane, which is the crystal plane of the Si {111} substrate in the present disclosure.

As illustrated in FIG. 18, there are 96 (=8×12) combinations of the {111} plane and the <110> direction. However, the <110> direction in the present disclosure is limited to a direction orthogonal to the {111} plane which is the element forming surface and a direction parallel to the element forming surface. Specifically, the combination of the element forming surface of the Si {111} substrate in the present disclosure and the orientation in which the Si {111} substrate is etched is selected from among the combinations represented by "○" in FIG. 18.

Further, in the present embodiment, the case where the etching on the Si {111} substrate proceeds in the X-axis direction but does not proceed in the Y-axis direction and the Z-axis direction is exemplified. However, the present disclosure is not limited to this, and it is sufficient that the orientation in which the etching proceeds is in both the X-axis direction and the Y-axis direction, or in either the X-axis direction or the Y-axis direction.

It is known that, in performing crystalline anisotropic etching with an etching solution on a Si substrate, when an alkaline solution is used in the etching, for example, the Si etching reaction with the alkaline solution proceeds with the reaction between the Si bonds and OH ions, and as a result, the more the dangling bonds exposed on the surface side, the easier the etching proceeds, and the more the back bonds extending to the bulk side, the more difficult the etching proceeds.

Specifically, a horizontal light-shielding portion has one or two Si back bonds, at least less than three back bonds in a direction substantially horizontal to the substrate surface, whereas the horizontal light-shielding portion has three Si back bonds substantially vertical to the substrate surface. For example, referring to an example of FIG. 19, when the Si dangling bond side in the normal to the Si {111} plane is defined as the positive direction, the back bond represents a bond extending in the negative direction on the opposite side.

Figure 19:
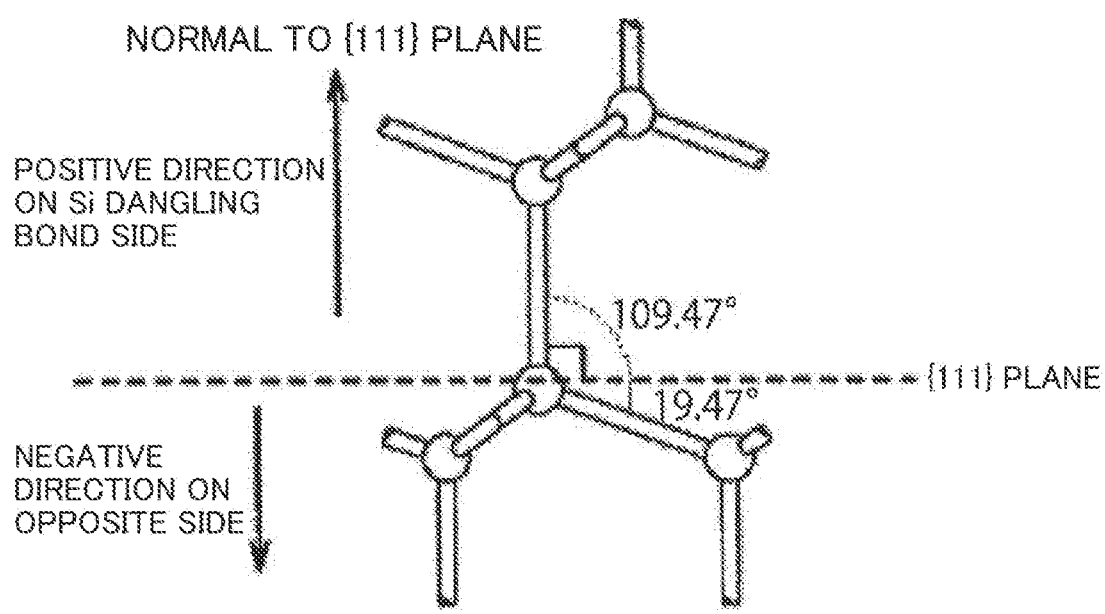
FIG. 19 is a schematic diagram for explaining the back bond in the crystal plane of the Si substrate in the present disclosure.

FIG. 19 illustrates an example of three back bonds at −19.47° to +19.47° with respect to the {111} plane. Specifically, when the photoelectric conversion unit, the horizontal light-shielding portion, and the charge holding unit are provided on a Si {111} substrate, the horizontal light-shielding portion has a first plane that is along a first crystal plane of the Si {111} substrate that is orthogonal to a first direction and is represented by the plane index {111}; and a second plane that is along a second crystal plane of the Si {111} substrate that is tilted with respect to the first direction and is represented by the plane index {111}.

Figure 20:
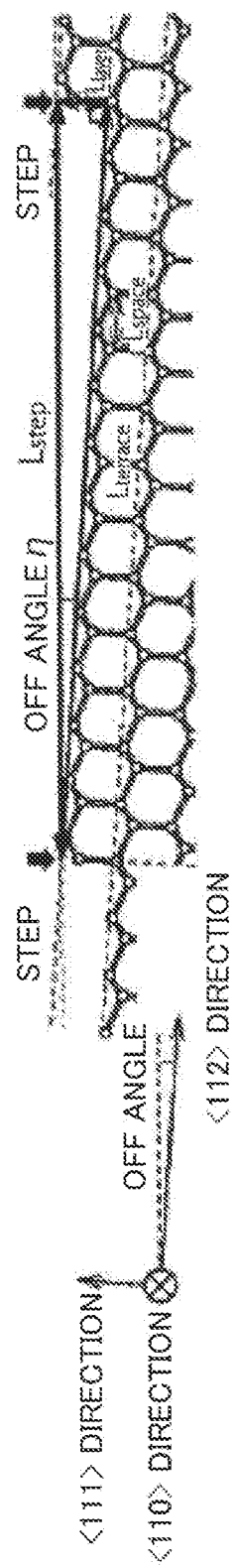
FIG. 20 is a schematic diagram for explaining the off angle on the surface of the Si substrate in the present disclosure.

The Si {111} substrate also includes, for example, as illustrated in FIG. 20, a substrate in which the surface of the substrate is processed so as to have an off angle with respect to the <112> direction. For an off angle of 19.47° or less, even in the case of a substrate having an off angle, a relationship is maintained in which the etching rate in the <110> direction, that is, the direction of one Si back bond is sufficiently higher than the etching rate in the <111> direction, that is, the direction of three Si back bonds. As the off angle increases, the number of steps increases and the density of microsteps increases, and thus the off angle is preferably 5° or less. It is to be noted that, the example of FIG. 20 is for the case where the substrate surface has an off angle in the <112> direction, but the case where the substrate surface has an off angle in the <110> direction may be possible, and the off angle may have any direction whatever. Further, the Si plane orientation can be analyzed by using an X-ray diffraction method, an electron beam diffraction method, an electron backscatter diffraction method, or the like. Since the number of Si back bonds is to be determined by the Si product structure, the number of back bonds can also be analyzed by analyzing the Si plane orientation.

Figure 3:
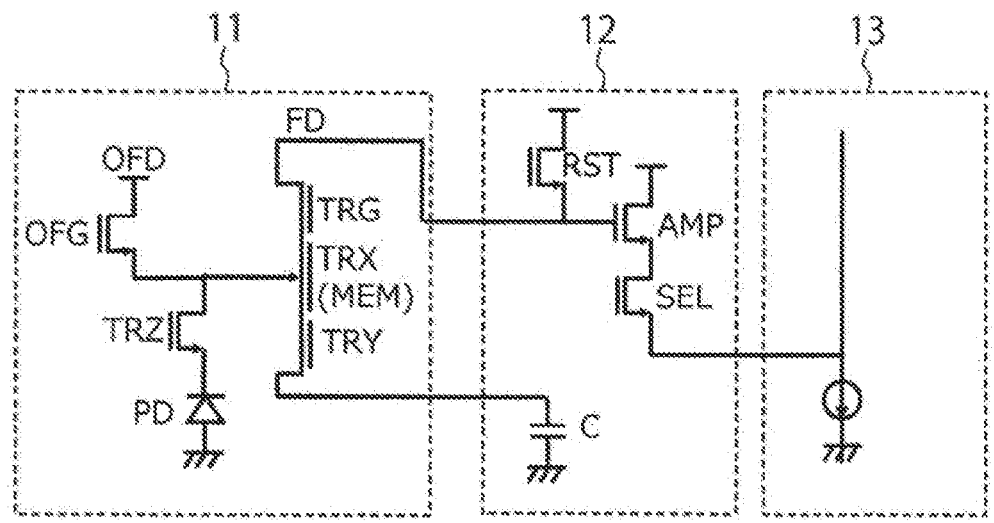
FIG. 3 is a circuit diagram illustrating a configuration of the solid-state image pickup device according to the first embodiment.

FIG. 3 is a circuit diagram illustrating a configuration of the solid-state image pickup device according to the first embodiment.

FIG. 3 illustrates various types of circuit elements provided in the upper substrate 11, the intermediate substrate 12, and the lower substrate 13. The upper substrate 11 includes the photodiode PD, the memory unit MEM, the floating diffusion unit FD, the diffusion unit OFD, the first transfer transistor TRZ, the second transfer transistor TRY, the third transfer transistor TRX, the fourth transfer transistor TRG, and the fifth transfer transistor OFG. The intermediate substrate 12 includes the reset transistor RST, the amplification transistor AMP, the selection transistor SEL, and the capacitor C. The lower substrate 13 includes the constant current source as illustrated in FIG. 3.

The fourth transfer transistor TRG, the third transfer transistor TRX, and the second transfer transistor TRY are arranged in series between the floating diffusion unit FD and the capacitor C, and are provided in the vicinity of the memory unit MEM. One main terminal of the first transfer transistor TRZ is connected to the cathode of the photodiode PD, and the other main terminal of the first transfer transistor TRZ is provided in the vicinity of the memory unit MEM and the third transfer transistor TRX. One main terminal of the fifth transfer transistor OFG is connected to the diffusion unit OFD, and the other main terminal of the fifth transfer transistor OFG is provided in the vicinity of the memory unit MEM and the third transfer transistor TRX.

The reset transistor RST has a source terminal connected to the floating diffusion unit FD and a drain terminal connected to a power supply line (VDD line). The amplification transistor AMP has a gate terminal connected to a source terminal of the floating diffusion unit FD and to the floating diffusion unit FD, a drain terminal connected to the power supply line (VDD line), and a source terminal connected to the selection transistor SEL. The amplification transistor AMP and the selection transistor SEL are arranged in series between the power supply line (VDD line) and the constant current source. The source terminal of the amplification transistor AMP is electrically connected to the vertical signal line 8 (FIG. 1) via the selection transistor SEL, so that the source follower circuit is made up of the amplification transistor AMP and this constant current source that is electrically connected to the vertical signal line 8.

Figure 4:
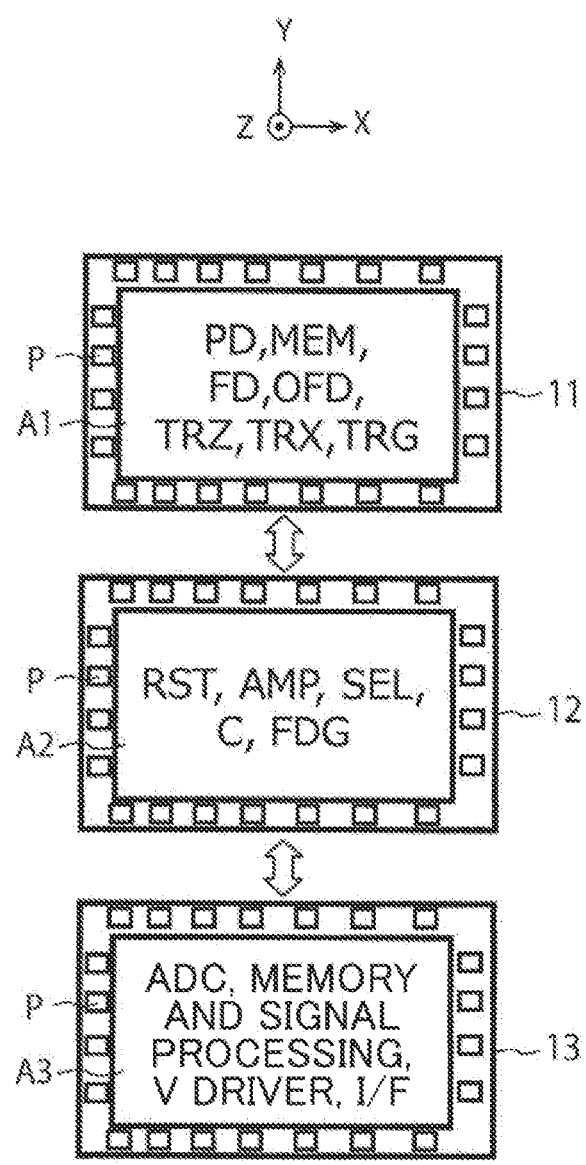
FIG. 4 is a plan view schematically illustrating the structure of the solid-state image pickup device according to the first embodiment.

FIG. 4 is a plan view schematically illustrating the structure of the solid-state image pickup device according to the first embodiment.

FIG. 4 schematically illustrates the plan configuration of the upper substrate 11, the intermediate substrate 12, and the lower substrate 13. Reference character P represents a pad electrode. Reference character A1 represents a region in which the photodiode PD, the memory unit MEM, the floating diffusion unit FD, the diffusion unit OFD, the first transfer transistor TRZ, the second transfer transistor TRY (not illustrated), the third transfer transistor TRX, the fourth transfer transistor TRG, the fifth transfer transistor OFG (not illustrated), and the like are arranged in the upper substrate 11. Reference character A2 represents a region in which the reset transistor RST, the amplification transistor AMP, the selection transistor SEL, the capacitor C, an FDG (conversion gain switching unit), and the like are arranged in the intermediate substrate 12. Reference character A3 represents a region in which logic circuits such as an ADC (analog-digital conversion unit), a memory and signal processing unit, a V driver, and an I/F (interface) are arranged in the lower substrate 13. The pad electrodes P of the present embodiment are disposed around the region A1, around the region A2, and around the region A3.

The amplification transistor AMP of the present embodiment is disposed not in the region A1 of the upper substrate 11 but in the region A2 of the intermediate substrate 12. This makes it possible to provide the amplification transistor AMP on a substrate other than the 11111 substrate, so that the deterioration of the S/N ratio in the source follower circuit can be suppressed. Further, it is possible to reduce the area of the region A1 by disposing the amplification transistor AMP in the region A2.

Further, the amplification transistor AMP of the present embodiment is disposed not in the region A3 of the lower substrate 13 but in the region A2 of the intermediate substrate 12. This makes it possible to suppress an increase in the area of the region A3 due to the amplification transistor AMP.

In this way, the amplification transistor AMP of the present embodiment is disposed in the region A2 of the intermediate substrate 12. When the area of the region A2 is set to be substantially the same as the area of the region A1 or the area of the region A3, a circuit element other than the amplification transistor AMP can be disposed in the region A2. Accordingly, in the present embodiment, the reset transistor RST, the selection transistor SEL, the capacitor C, and the FDG are arranged in the region A2. According to the present embodiment, it is possible to increase the amount of saturated charge by disposing the capacitor C, which is the internal capacitance of the pixel, in the region A2.

According to the present embodiment, it is possible to reduce the area of the region A1 and the area of the region A3 by disposing the amplification transistor AMP in the region A2. In addition, it is possible to reduce the area of the integrated circuit of the solid-state image pickup device of the present embodiment by setting the area of the region A2 to be substantially the same as the area of the region A1 or the area of the region A3.

As described above, the photodiode PD of the present embodiment is provided in the substrate 21, which is a substrate other than a {100} substrate, and the amplification transistor AMP of the present embodiment is provided on the substrate 31, which has a crystal plane different from the crystal plane of the substrate 21. Therefore, according to the present embodiment, it is possible to use a substrate other than a {100} substrate while suppressing the problem of a substrate (e.g., {111} substrate) other than the {100} substrate.

Solid-state image pickup devices of the second, third, and fourth embodiments will be described below. In the following description, the differences between these embodiments and the first embodiment will be mainly described, and the common points between these embodiments and the first embodiment will be omitted.

Second Embodiment

Figure 5:
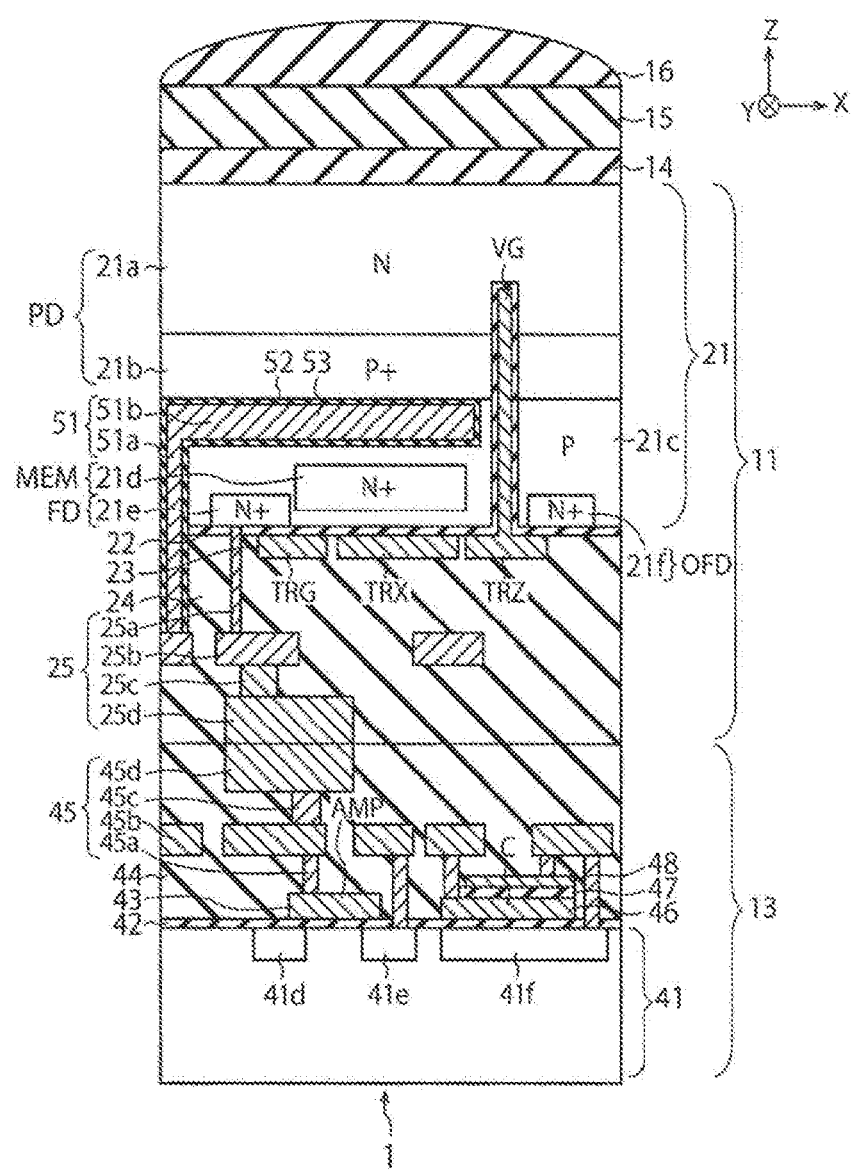
FIG. 5 is a cross-sectional view illustrating a structure of a solid-state image pickup device according to a second embodiment.

FIG. 5 is a cross-sectional view illustrating a structure of a solid-state image pickup device according to a second embodiment.

The solid-state image pickup device of the present embodiment includes an upper substrate 11 and a lower substrate 13, but does not include an intermediate substrate 12.

The upper substrate 11 includes a multilayer wiring structure 25 in addition to the components illustrated in FIG. 2. The multilayer wiring structure 25 is provided in the interlayer insulating film 24, and includes a contact plug 25a, a wiring layer 25b, a via plug 25c, and a metal pad 25d. The contact plug 25a is provided on the lower surface of a floating diffusion unit FD. The wiring layer 25b includes a plurality of lines such as lines provided under the contact plug 25a. The via plug 25c is provided under the wiring layer 25b. The metal pad 25d is provided under the via plug 25c and is joined to a metal pad 45d of the lower substrate 13. As a result, the upper substrate 11 and the lower substrate 13 are electrically connected to each other via these metal pads 25d and 45d. A vertical trench 51a extends in the vertical direction from the upper surface of the wiring layer 25b through the lower surface of a substrate 21.

In addition to the components illustrated in FIG. 2, the lower substrate 13 includes a reset transistor RST (not illustrated), an amplification transistor AMP, a selection transistor SEL (not illustrated), and a capacitor C. As with the lower substrate 13 of the first embodiment, the lower substrate 13 of the present embodiment includes a transistor TR included in a logic circuit, but the illustration thereof is omitted.

The lower substrate 13 includes the substrate 41, the insulating film 42, the gate electrode 43, the interlayer insulating film 44, and the multilayer wiring structure 45, which are mentioned above, and further includes a lower electrode 46, an insulating film 47, and an upper electrode 48. The substrate 41 includes the diffusion layers 41a, 41b, and 41c (not illustrated), which are mentioned above, and further includes diffusion layers 41d, 41e, and 41f. The multilayer wiring structure 45 includes the contact plugs 45a, the wiring layer 45b, the via plug 45c, and the metal pad 45d, which are mentioned above.

The substrate 41 is provided below the substrate 21 via the interlayer insulating films 24 and 44. The substrate 41 of the present embodiment functions as a support substrate that supports the substrate 21.

The insulating film 42 is provided on the upper surface of the substrate 41. The insulating film 42 functions as the gate insulating film of the reset transistor RST (not illustrated), the amplification transistor AMP, the selection transistor SEL (not illustrated), and the transistor TR (not illustrated), and as the lower dielectric film of the capacitor C.

The gate electrode 43 is provided on the upper surface of the insulating film 42. The gate electrode 43 is included in the reset transistor RST (not illustrated), the amplification transistor AMP, the selection transistor SEL (not illustrated), and the transistor TR (not illustrated).

The diffusion layers 41d and 41e in the substrate 41 function as the drain region and the source region of the amplification transistor AMP. The gate electrode 43 of the amplification transistor AMP is electrically connected to the floating diffusion unit FD.

The lower electrode 46, the insulating film 47, and the upper electrode 48 are provided on the upper surface of the insulating film 42 in this order. The lower electrode 46 is, for example, a semiconductor layer such as a silicon layer, or a metal layer such as a tungsten layer, an aluminum layer, a copper layer, or a metal silicide layer. The gate electrode 43 and the lower electrode 46 of the present embodiment are included in the same electrode layer, and are formed by forming that electrode layer on the surface of the insulating film 42 and processing the electrode layer by etching. The insulating film 47 is, for example, a silicon oxide film, and functions as the upper dielectric film of the capacitor C. The upper electrode 48 is, for example, a semiconductor layer such as a silicon layer, or a metal layer such as a tungsten layer, an aluminum layer, a copper layer, or a metal silicide layer.

The capacitor C includes three electrodes, the diffusion layer 41f, the lower electrode 46, and the upper electrode 48, and two dielectric films, the insulating film 42 and the insulating film 47, sandwiched between these electrodes. In this way, the capacitor C of the present embodiment is provided on the upper surface of the substrate 41, and the amplification transistor AMP of the present embodiment is also provided on the upper surface of this substrate 41. The amplification transistor AMP and the capacitor C of the present embodiment are provided in the same layer. Specifically, the gate insulating film (insulating film 42) and the gate electrode 43 of the amplification transistor AMP are provided in the same layer as the lower dielectric film (insulating film 42) and the lower electrode 46 of the capacitor C, respectively. The capacitor C of the present embodiment is used, for example, as the pixel internal capacitance of the corresponding pixel 1.

The interlayer insulating film 44 is formed on the upper surface of the substrate 41 so as to cover the insulating film 42, the gate electrode 43, the lower electrode 46, the insulating film 47, the upper electrode 48, and the like.

The multilayer wiring structure 45 is provided in the interlayer insulating film 44, and includes the contact plugs 45a, the wiring layer 45b, the via plug 45c, and the metal pad 45d, which are mentioned above. The contact plugs 45a are provided on the upper surfaces of the diffusion layers 41a, 41b, 41c, 41d, 41e, and 41f, the gate electrode 43, the lower electrode 46, the upper electrode 48, and the like. The wiring layer 45b includes a plurality of lines provided on these contact plugs 45a. The via plug 45c is provided on the wiring layer 45b. The metal pad 45d is provided on the via plug 45c and is joined to the metal pad 25d of the upper substrate 11. As a result, the upper substrate 11 and the lower substrate 13 are electrically connected to each other via these metal pads 25d and 45d. The floating diffusion unit FD and the gate electrode 43 of the amplification transistor AMP of the present embodiment are electrically connected to each other via the metal pads 25d and 45d.

Figure 6:
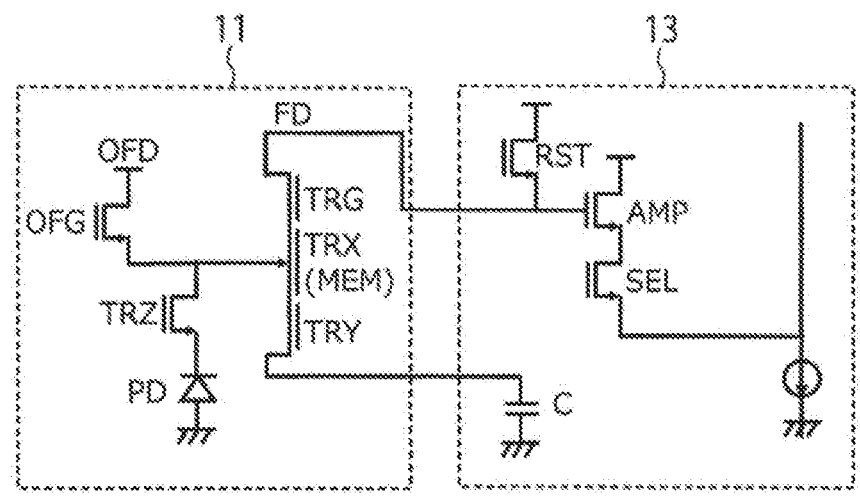
FIG. 6 is a circuit diagram illustrating a configuration of the solid-state image pickup device according to the second embodiment.

FIG. 6 is a circuit diagram illustrating a configuration of the solid-state image pickup device according to the second embodiment.

FIG. 6 illustrates various types of circuit elements provided in the upper substrate 11, the intermediate substrate 12, and the lower substrate 13. Note that, in the present embodiment, the reset transistor RST, the amplification transistor AMP, the selection transistor SEL, and the capacitor C are provided in the lower substrate 13.

Figure 7:
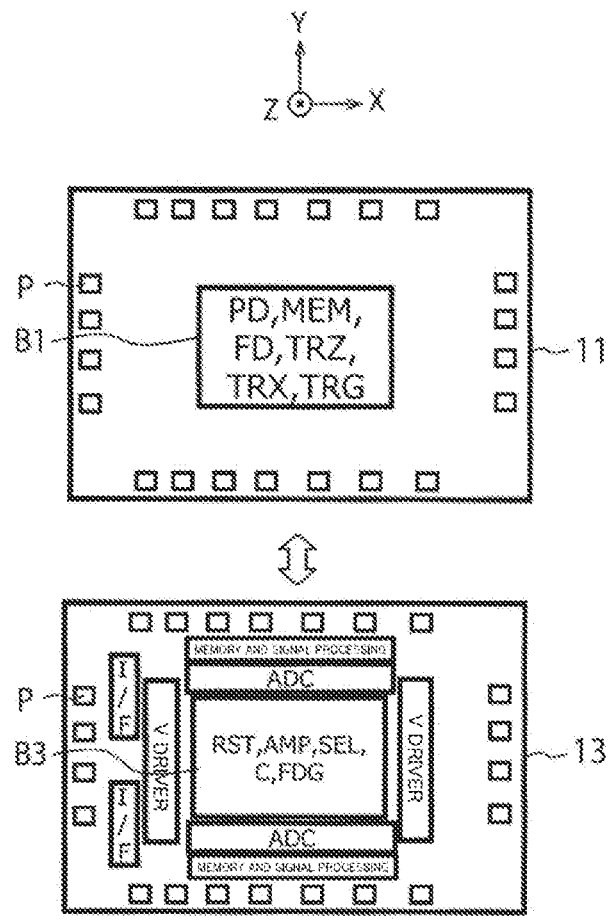
FIG. 7 is a plan view schematically illustrating the structure of the solid-state image pickup device according to the second embodiment.

FIG. 7 is a plan view schematically illustrating the structure of the solid-state image pickup device according to the second embodiment.

FIG. 7 schematically illustrates the plan configuration of the upper substrate 11, the intermediate substrate 12, and the lower substrate 13. Reference character P represents a pad electrode. Reference character B1 represents a region in which the photodiode PD, a memory unit MEM, the floating diffusion unit FD, a diffusion unit OFD, a first transfer transistor TRZ, a second transfer transistor TRY (not illustrated), a third transfer transistor TRX, a fourth transfer transistor TRG, a fifth transfer transistor OFG (not illustrated), and the like are arranged in the upper substrate 11. Reference character B3 represents a region in which the reset transistor RST, the amplification transistor AMP, the selection transistor SEL, the capacitor C, an FDG, and the like are arranged in the lower substrate 13. Logic circuits such as ADCs, memory and signal processing units, V drivers, and I/Fs of the present embodiment are arranged around the region B3. Further, the pad electrodes P of the present embodiment are arranged around the region B1 and around the region B3 and the logic circuits.

According to the present embodiment, it is possible to reduce the cost of the substrates for manufacturing the solid-state image pickup device because the intermediate substrate 12 is not used. Further, according to the present embodiment, by forming the amplification transistor AMP or the like and the logic circuit(s) on the same substrate 41, it is possible to simplify the process of forming the amplification transistor AMP and the like and the logic circuit(s) as compared with the case of forming the amplification transistor AMP and the like and the logic circuit(s) on different substrates. On the other hand, in the present embodiment, since the logic circuits are arranged around the region B3, the area of the integrated circuit of the solid-state image pickup device becomes larger than that in the case of the first embodiment. The structure of the present embodiment is employed, for example, when it is desired to reduce the cost of the substrates.

As described above, the photodiode PD of the present embodiment is provided in the substrate 21, which is a substrate other than a {100} substrate, and the amplification transistor AMP of the present embodiment is provided on the substrate 41, which has a crystal plane different from the crystal plane of the substrate 21. Therefore, according to the present embodiment, it is possible to use a substrate other than a {100} substrate while suppressing the problem of the substrate (e.g., a {111} substrate) other than the {100} substrate.

Third Embodiment

Figure 8:
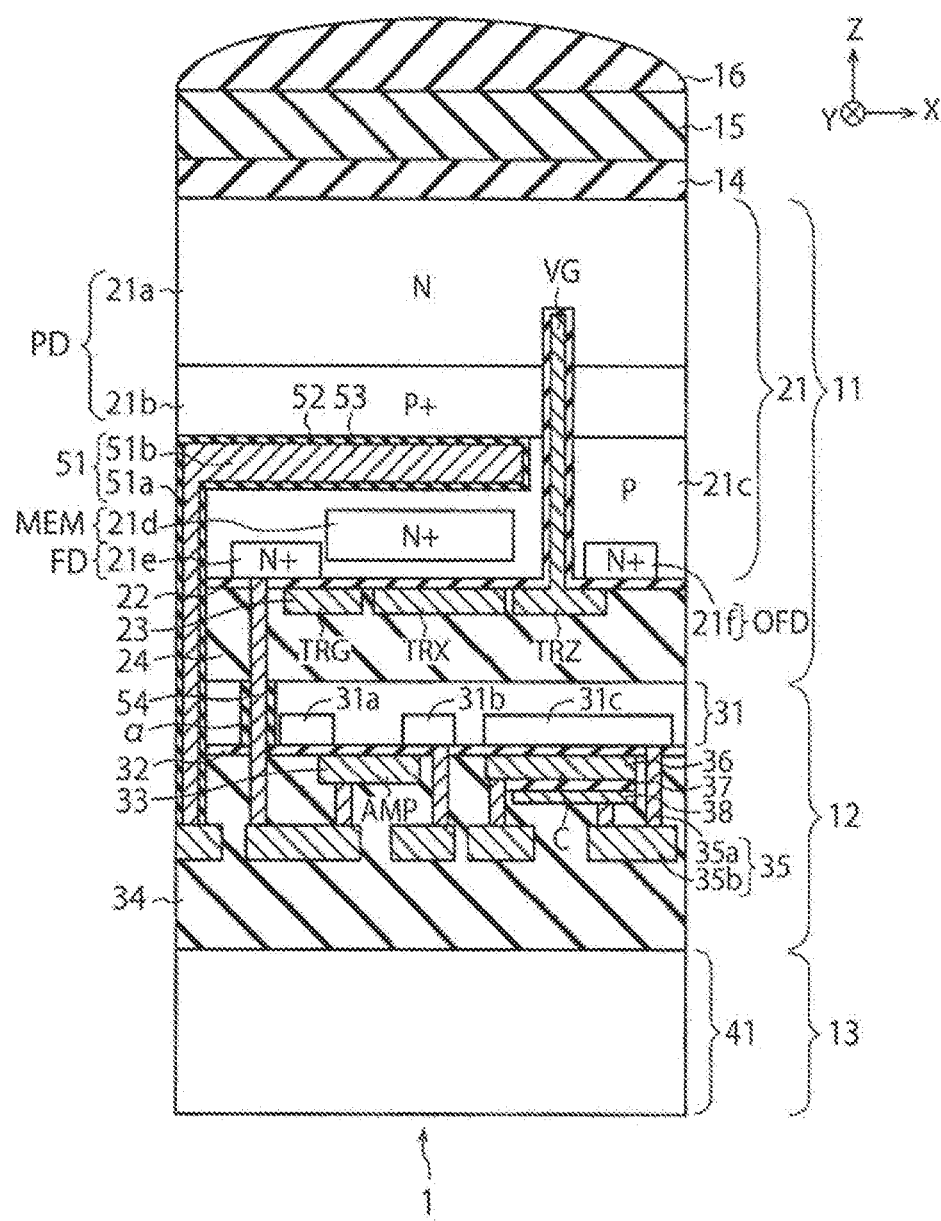
FIG. 8 is a cross-sectional view illustrating a structure of a solid-state image pickup device according to a third embodiment.

FIG. 8 is a cross-sectional view illustrating a structure of a solid-state image pickup device according to a third embodiment.

The solid-state image pickup device of the present embodiment includes an upper substrate 11, an intermediate substrate 12, and a lower substrate 13. However, the lower substrate 13 of the present embodiment includes only a substrate 41, and functions exclusively as a support substrate that supports a substrate 21 and a substrate 31. Logic circuits of the present embodiment are provided not on the upper surface of the substrate 41 but on the lower surface of the substrate 31.

Figure 9:
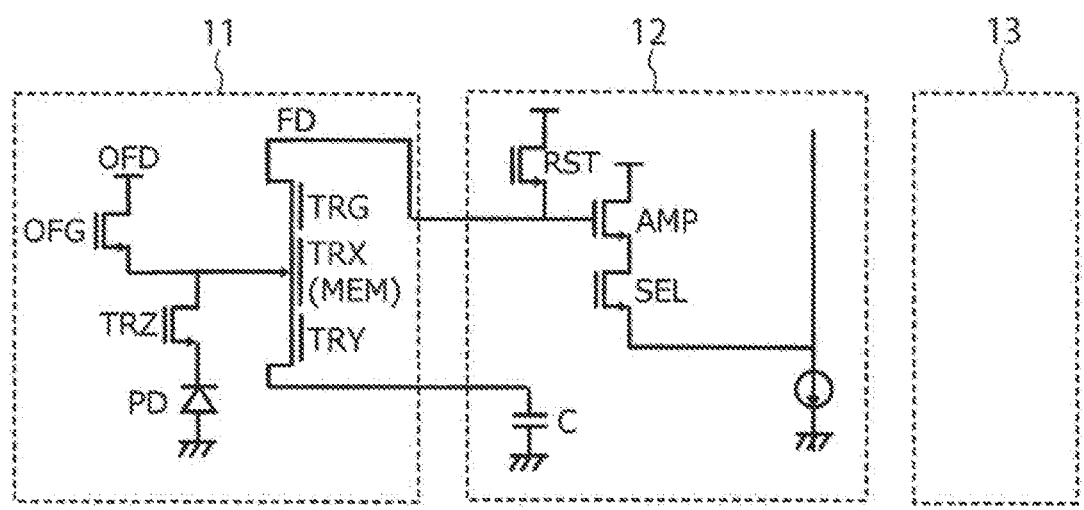
FIG. 9 is a circuit diagram illustrating a configuration of the solid-state image pickup device according to the third embodiment.

FIG. 9 is a circuit diagram illustrating a configuration of the solid-state image pickup device according to the third embodiment.

FIG. 9 illustrates various types of circuit elements provided in the upper substrate 11, the intermediate substrate 12, and the lower substrate 13. Note that, in the present embodiment, a constant current source is provided in the intermediate substrate 12.

Figure 10:
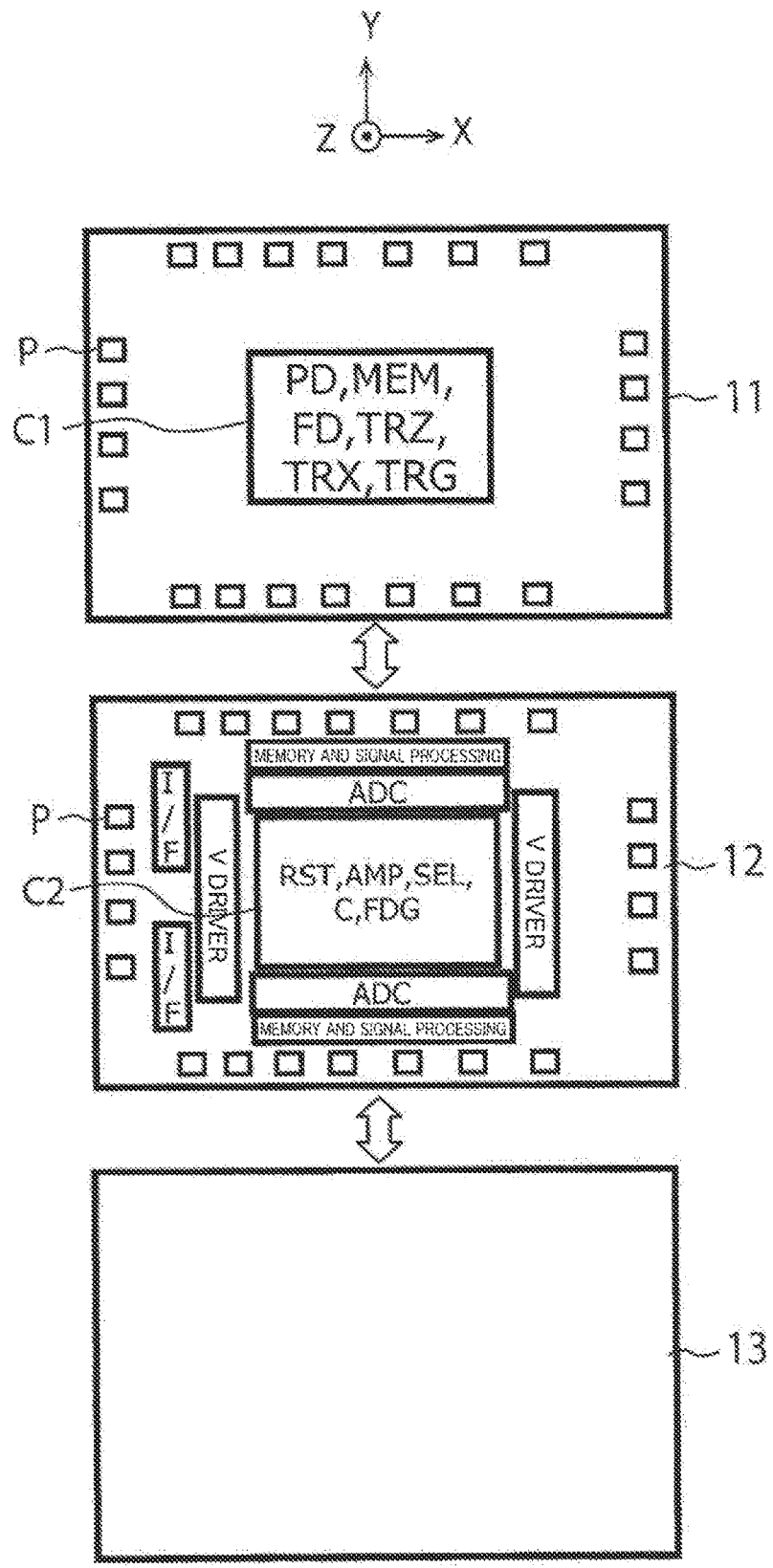
FIG. 10 is a plan view schematically illustrating the structure of the solid-state image pickup device according to the third embodiment.

FIG. 10 is a plan view schematically illustrating the structure of the solid-state image pickup device according to the third embodiment.

FIG. 10 schematically illustrates the plan configuration of the upper substrate 11, the intermediate substrate 12, and the lower substrate 13. Reference character P represents a pad electrode. Reference character C1 represents a region in which a photodiode PD, a memory unit MEM, the floating diffusion unit FD, a diffusion unit OFD, a first transfer transistor TRZ, a second transfer transistor TRY (not illustrated), a third transfer transistor TRX, a fourth transfer transistor TRG, a fifth transfer transistor OFG (not illustrated), and the like are arranged in the upper substrate 11. Reference character C2 represents a region in which a reset transistor RST, the amplification transistor AMP, a selection transistor SEL, a capacitor C, an FDG, and the like are arranged in the intermediate substrate 12. Logic circuits such as an ADC, memory and signal processing units, V drivers, and I/Fs of the present embodiment are arranged around the region C2. Further, the pad electrodes P of the present embodiment are arranged around the region C1 and around the region C2 and the logic circuits.

According to the present embodiment, it is possible to increase the degree of freedom in selecting the type of the substrate 41 by using the lower substrate 13 exclusively as a support substrate. Further, according to the present embodiment, by forming the amplification transistor AMP or the like and the logic circuit(s) on the same substrate 31, it is possible to simplify the process of forming the amplification transistor AMP and the like and the logic circuit(s) as compared with the case of forming the amplification transistor AMP and the like and the logic circuit(s) on different substrates. On the other hand, in the present embodiment, since the logic circuits are arranged around the region C2, the area of the integrated circuit of the solid-state image pickup device becomes larger than that in the case of the first embodiment. The structure of the present embodiment is employed, for example, when it is desired to increase the degree of freedom in selecting the type of the substrate 41.

As described above, the photodiode PD of the present embodiment is provided in the substrate 21, which is a substrate other than a {100} substrate, and the amplification transistor AMP of the present embodiment is provided on the substrate 31, which has a crystal plane different from the crystal plane of the substrate 21. Therefore, according to the present embodiment, it is possible to use a substrate other than a {100} substrate while suppressing the problem of the substrate (e.g., a {111} substrate) other than the {100} substrate.

Fourth Embodiment

Figure 11:
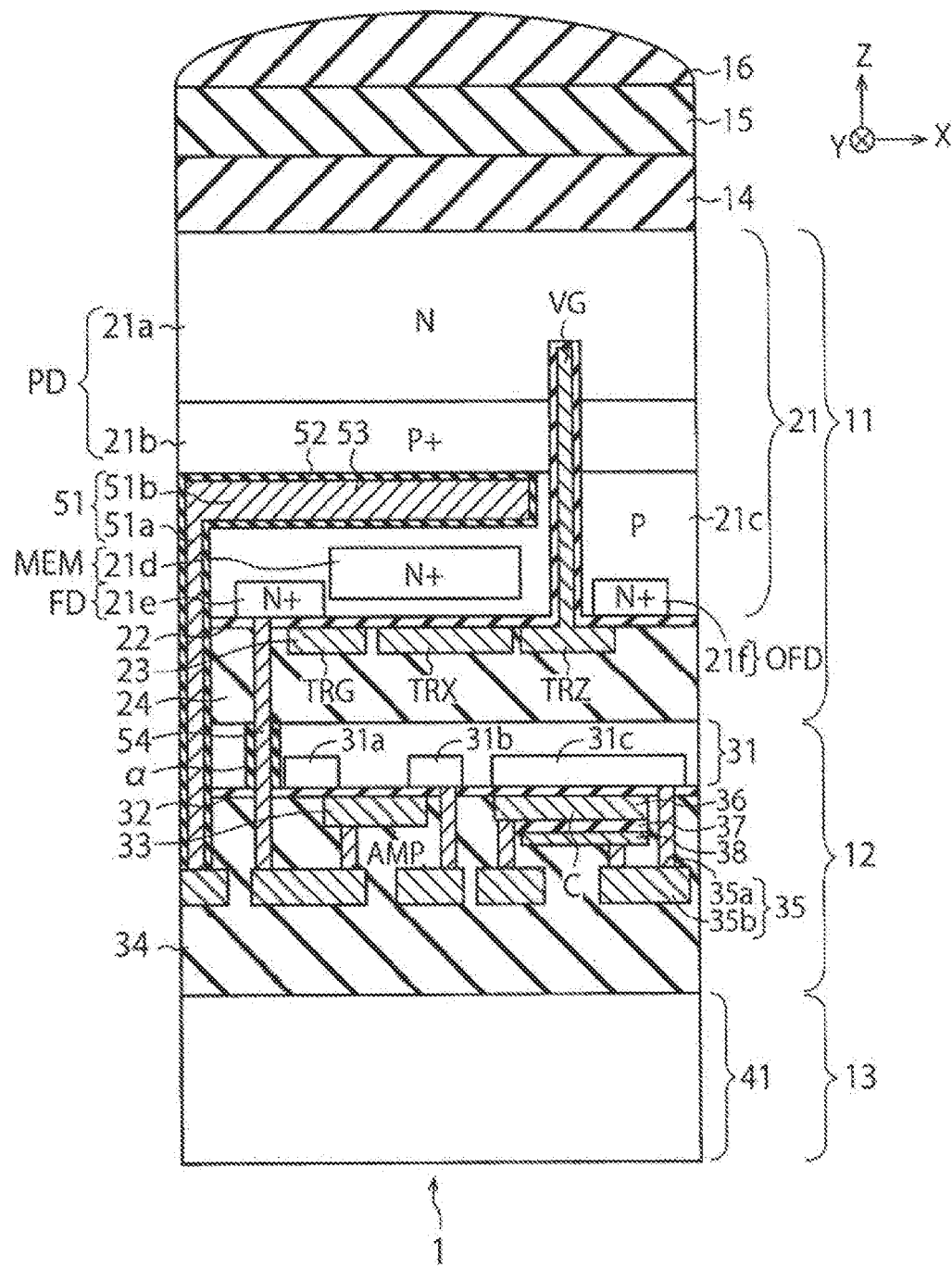
FIG. 11 is a cross-sectional view illustrating a structure of a solid-state image pickup device according to a fourth embodiment.

FIG. 11 is a cross-sectional view illustrating a structure of a solid-state image pickup device according to a fourth embodiment. FIG. 11 illustrates a vertical cross section of one pixel 1 included in the pixel array region 2 of FIG. 1.

The solid-state image pickup device of the present embodiment includes an upper substrate 11, an intermediate substrate 12, and a lower substrate 13. However, the lower substrate 13 of the present embodiment includes only a substrate 41, and functions exclusively as a support substrate that supports a substrate 21 and a substrate 31. Logic circuits of the present embodiment are provided not on the upper surface of the substrate 41 but on the lower surface of the substrate 31 and the upper surface or the lower surface of a substrate 61 described later.

Figure 12:
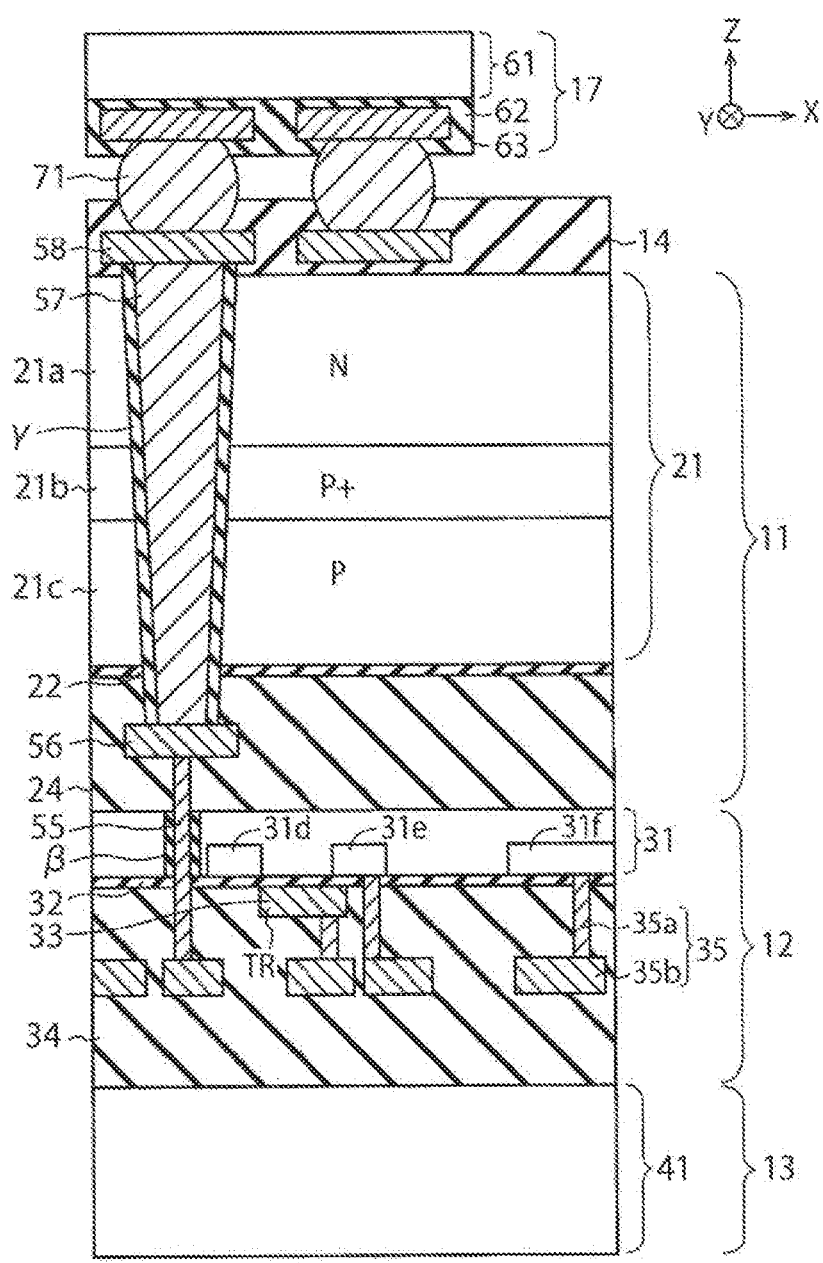
FIG. 12 is another cross-sectional view illustrating the structure of the solid-state image pickup device according to the fourth embodiment.

FIG. 12 is another cross-sectional view illustrating the structure of the solid-state image pickup device according to the fourth embodiment. FIG. 12 illustrates a vertical cross section of the solid-state image pickup device of the present embodiment, but the illustrated vertical cross section is different from the vertical cross section illustrated in FIG. 11.

FIG. 12 illustrates the upper substrate 11, the intermediate substrate 12, and the lower substrate 13 as in FIG. 11. The intermediate substrate 12 includes a transistor TR included in a logic circuit, and includes diffusion layers 31*d*, 31*e*, and 31*f* in the substrate 31. The diffusion layers 31*d* and 31*e* in the substrate 31 function as the drain region and the source region of the transistor TR. An insulating film 32 functions as the gate insulating film of the transistor TR, and a gate electrode 43 is included in the transistor TR.

The solid-state image pickup device of the present embodiment further includes a plug 55; a wiring layer 56; a plug 57; a plurality of metal pads 58; a substrate 61, an insulating film 62, and a plurality of metal pads 63 which are in a stack substrate 17; and a plurality of solder balls 71. The substrate 61 is an example of a fourth substrate in the present disclosure. The stack substrate 17 of the present embodiment is a logic board (logic chip) including a logic circuit.

The plug 55 is provided on a wiring layer 35*b*. The plug 55 is provided in the substrate 31 via an insulating film B. The wiring layer 56 includes a line provided on the plug 55 and is disposed in an interlayer insulating film 24. The plug 57 is provided on the line in the wiring layer 56. The plug 57 is provided in the substrate 21 or the like via an insulating film y. The plurality of metal pads 58 include a metal pad 58 provided on the plug 57 and is arranged in a planarization film 14. The upper surfaces of these metal pads 58 are exposed from the planarization film 14. The planarization film 14 is, for example, an insulating film whose upper surface is planarized by CMP.

The substrate 61 is provided above the substrate 21 via the solder balls 71 or the like. The substrate 61 is, for example, a semiconductor substrate such as a silicon substrate. The substrate 61 of the present embodiment has a crystal plane different from the crystal plane of the substrate 21. Specifically, the substrate 61 of the present embodiment is a semiconductor substrate other than a {111} substrate, for example, a {100} substrate. The substrate 61 may be a {110} substrate. In the present embodiment, a logic circuit may be provided on the upper surface of the substrate 61, or a logic circuit may be provided on the lower surface of the substrate 61.

The insulating film 62 is provided on the lower surface of the substrate 61. The insulating film 62 is, for example, a silicon oxide film.

The plurality of metal pads 63 are provided in the insulating film 62. The lower surfaces of these metal pads 63 are exposed from the insulating film 62.

Each solder ball 71 is provided between the metal pad 58 and the metal pad 63. As a result, the stack substrate 17 is electrically connected to the upper substrate 11 and the intermediate substrate 12 via the metal pads 58 and 63 thereof.

Figure 13:
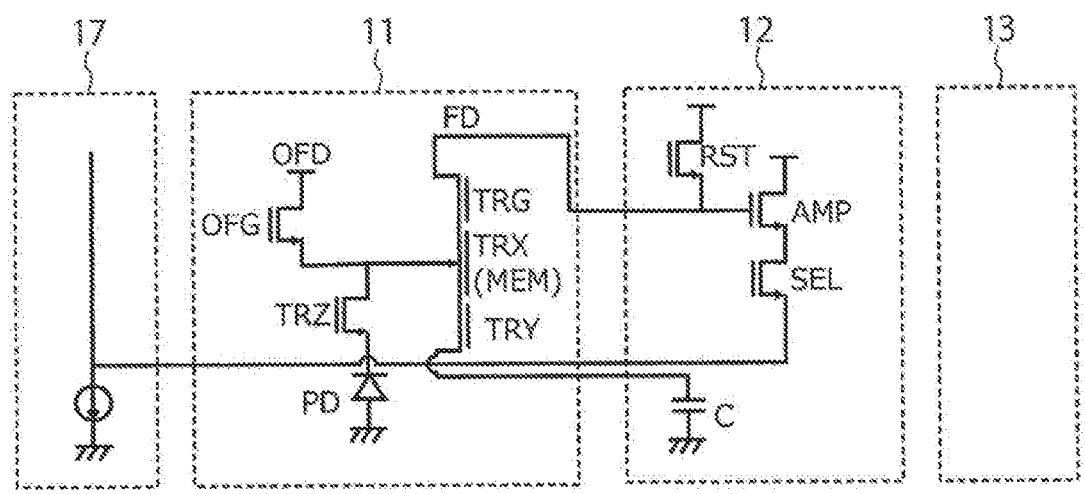
FIG. 13 is a circuit diagram illustrating a configuration of the solid-state image pickup device according to the fourth embodiment.

FIG. 13 is a circuit diagram illustrating a configuration of the solid-state image pickup device according to the fourth embodiment.

FIG. 13 illustrates various types of circuit elements provided in the upper substrate 11, the intermediate substrate 12, the lower substrate 13, and the stack substrate 17. Note that, in the present embodiment, a constant current source is provided in the stack substrate 17.

Figure 14:
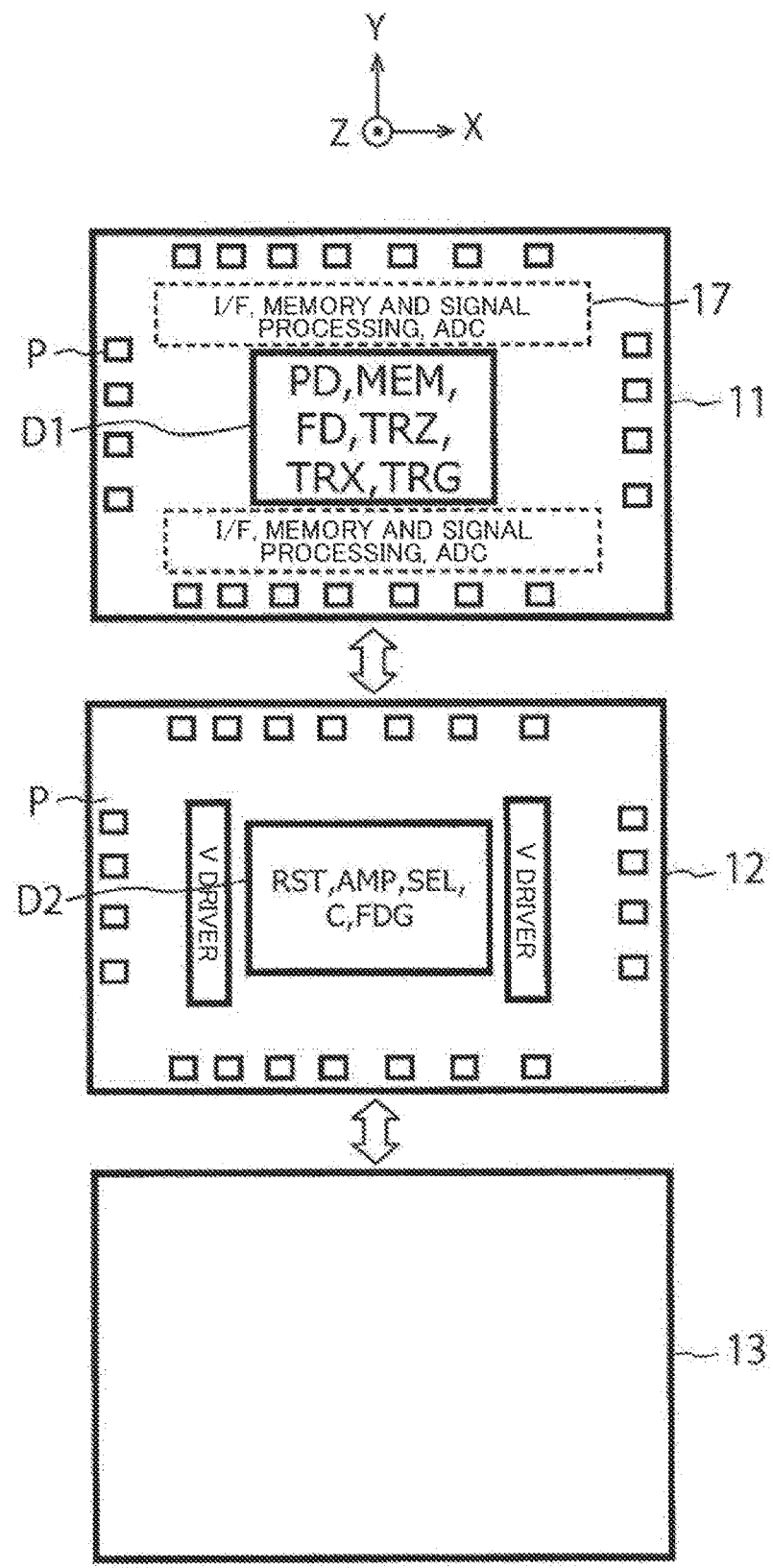
FIG. 14 is a plan view schematically illustrating the structure of the solid-state image pickup device according to the fourth embodiment.

FIG. 14 is a plan view schematically illustrating the structure of the solid-state image pickup device according to the fourth embodiment.

FIG. 14 schematically illustrates the plan configuration of the upper substrate 11, the intermediate substrate 12, and the lower substrate 13. Reference character P represents a pad electrode. Reference character D1 represents a region in which a photodiode PD, a memory unit MEM, a floating diffusion unit FD, a diffusion unit OFD, a first transfer transistor TRZ, a second transfer transistor TRY (not illustrated), a third transfer transistor TRX, a fourth transfer transistor TRG, a fifth transfer transistor OFG (not illustrated), and the like are arranged in the upper substrate 11. Reference character D2 represents a region in which a reset transistor RST, an amplification transistor AMP, a selection transistor SEL, a capacitor C, an FDG, and the like are arranged in the intermediate substrate 12. V drivers of the present embodiment are arranged around the region D2. On the other hand, other logic circuits such as ADCs, memory and signal processing units, the V drivers, and I/Fs of the present embodiment are arranged in the stack substrate 17 provided above a region around the region D1. Further, the pad electrodes P of the present embodiment are arranged around the region D1 and around the region D2 and the V drivers.

According to the present embodiment, it is possible to increase the degree of freedom in selecting the type of the substrate 41 by using the lower substrate 13 exclusively as a support substrate. Further, according to the present embodiment, by arranging most of the logic circuits in the stack substrate 17, it is possible to reduce the area of the integrated circuit of the solid-state image pickup device as compared with the case of the second and third embodiments. The structure of the present embodiment is employed, for example, when it is desired to reduce the area of the integrated circuit of the solid-state image pickup device while increasing the degree of freedom in selecting the type of the substrate 41. It is to be noted that the reset transistor RST, the amplification transistor AMP, and the selection transistor SEL of the present embodiment may be arranged in the stack substrate 17.

As described above, the photodiode PD of the present embodiment is provided in the substrate 21, which is a substrate other than a {100} substrate, and the amplification transistor AMP of the present embodiment is provided on the substrate 31, which has a crystal plane different from the crystal plane of the substrate 21. Therefore, according to the present embodiment, it is possible to use a substrate other than a {100} substrate while suppressing the problem of the substrate (e.g., a {111} substrate) other than the {100} substrate.

APPLICATION EXAMPLES

Figure 15:
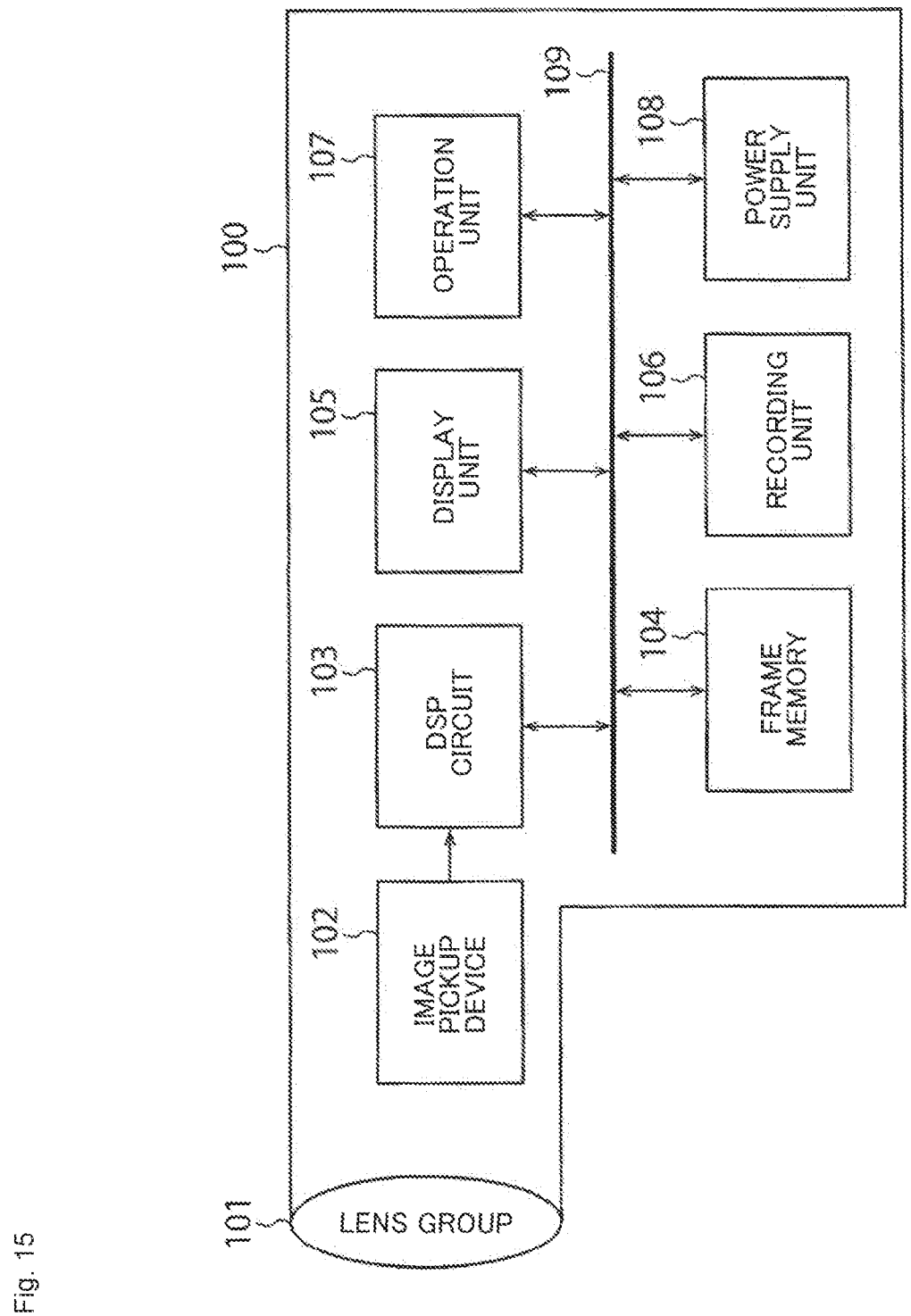
FIG. 15 is a block diagram illustrating a configuration example of an electronic apparatus.

FIG. 15 is a block diagram illustrating a configuration example of an electronic apparatus. The electrical apparatus illustrated in FIG. 15 is a camera 100.

The camera 100 includes an optical unit 101 including a lens group and the like; an image pickup device 102 which is a solid-state image pickup device according to any one of the first to fourth embodiments; a DSP (Digital Signal Processor) circuit 103 which is a camera signal processing circuit; a frame memory 104; a display unit 105; a recording unit 106; an operation unit 107; and a power supply unit 108. Further, the DSP circuit 103, the frame memory 104, the display unit 105, the recording unit 106, the operation unit 107, and the power supply unit 108 are connected to each other via a bus line 109.

The optical unit 101 captures incident light (image light) from a subject and forms an image on an image pickup surface of the image pickup device 102. The image pickup device 102 converts the amount of incident light whose image is formed on the image pickup surface by the optical unit 101 into an electric signal pixel by pixel, and outputs the electric signal as a pixel signal.

The DSP circuit 103 performs signal processing on the pixel signal output by the image pickup device 102. The frame memory 104 is a memory for storing one screen of a moving image or a still image captured by the image pickup device 102.

The display unit 105 includes a panel-type display device such as a liquid crystal panel or an organic EL panel, and displays a moving image or a still image captured by the image pickup device 102. The recording unit 106 records a moving image or a still image captured by the image pickup device 102 on a recording medium such as a hard disk or a semiconductor memory.

The operation unit 107 issues operation commands for various functions of the camera 100 in accordance with user's operations. The power supply unit 108 supplies various types of power sources that serve as operating power sources for the DSP circuit 103, the frame memory 104, the display unit 105, the recording unit 106, and the operation unit 107 to such supply targets as appropriate.

By using the solid-state image pickup device according to any one of the first to fourth embodiments as the image pickup device 102, a good image can be expected to be acquired.

That solid-state image pickup device can be applied to various other products. For example, that solid-state image pickup device may be mounted on various types of mobile objects such as an automobile, an electric vehicle, a hybrid electric vehicle, a motorcycle, a bicycle, a personal mobility, an airplane, a drone, a ship, and a robot.

Figure 16:
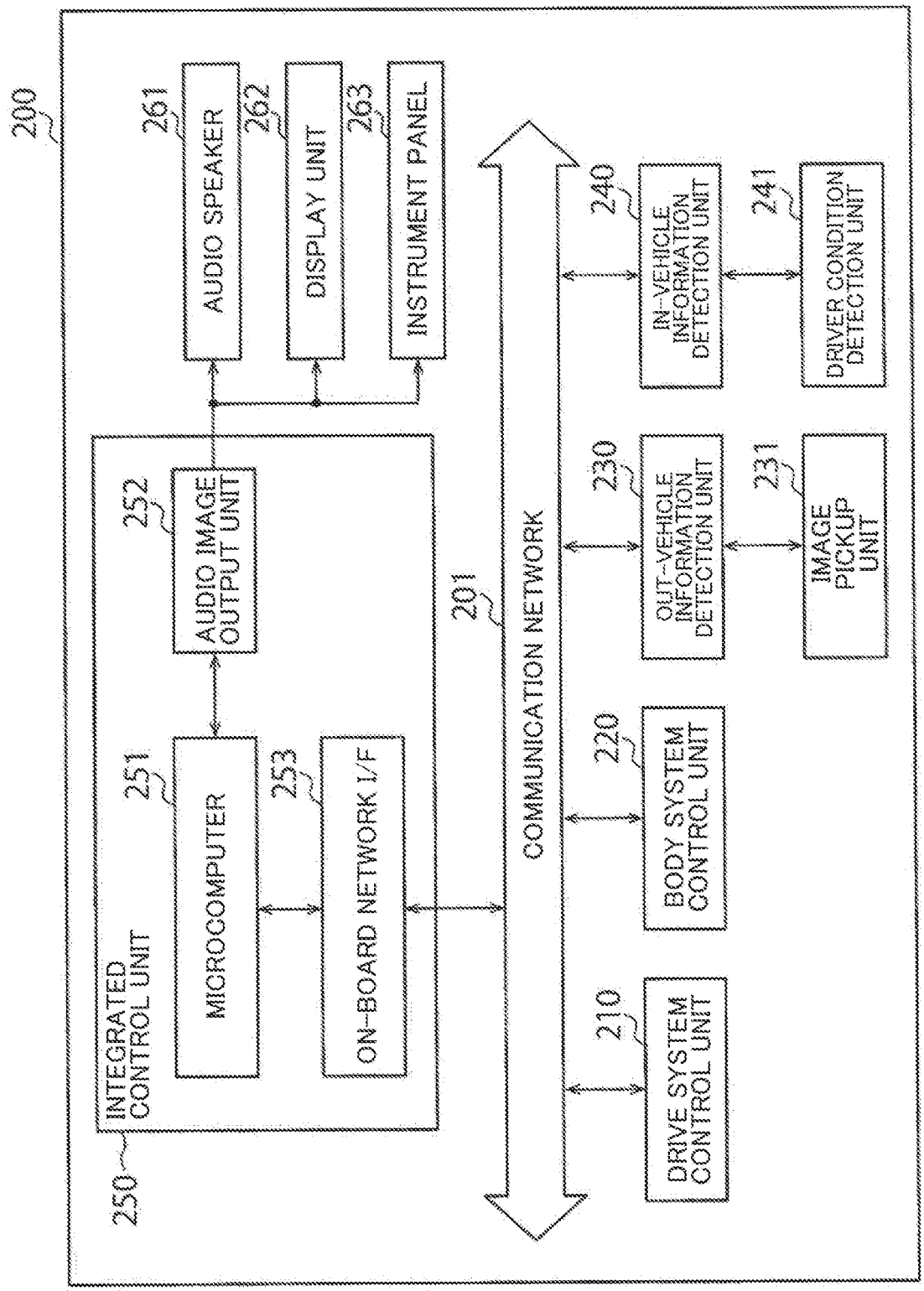
FIG. 16 is a block diagram illustrating a configuration example of a mobile object control system.

FIG. 16 is a block diagram illustrating a configuration example of a mobile object control system. The mobile object control system illustrated in FIG. 16 is a vehicle control system 200.

The vehicle control system 200 includes a plurality of electronic control units connected to each other via the communication network 201. In the example illustrated in FIG. 16, the vehicle control system 200 includes a drive system control unit 210, a body system control unit 220, an out-vehicle information detection unit 230, an in-vehicle information detection unit 240, and an integrated control unit 250. FIG. 16 further illustrates a microcomputer 251, an audio image output unit 252, and an on-board network I/F (Interface) 253 as components of the integrated control unit 250.

The drive system control unit 210 controls the operation of devices related to the drive system of a vehicle in accordance with various types of programs. For example, the drive system control unit 210 functions as a control device for a driving force generation device that generates a driving force of the vehicle, such as an internal combustion engine or a driving motor, a driving force transmission mechanism that transmits the driving force to wheels, a steering mechanism that adjusts the steering angle of the vehicle, a braking device that generates a braking force of the vehicle, and the like.

The body system control unit 220 controls the operation of various types of devices mounted on the vehicle body in accordance with various types of programs. For example, the body system control unit 220 functions as a control device such as a smart key system, a keyless entry system, a power window device, and various lamps (e.g., a headlamp, a back lamp, a brake lamp, a turn signal, and a fog lamp). In this case, a radio wave transmitted from a portable device that substitutes for a key or signals of various types of switches may be input to the body system control unit 220. The body system control unit 220 receives such radio wave or signals input and controls a door lock device, a power window device, a lamp, and the like of the vehicle.

The out-vehicle information detection unit 230 detects information outside the vehicle on which the vehicle control system 200 is mounted. For example, an image pickup unit 231 is connected to the out-vehicle information detection unit 230. The out-vehicle information detection unit 230 causes the image pickup unit 231 to capture an image of the outside of the vehicle, and receives the captured image from the image pickup unit 231. The out-vehicle information detection unit 230 may perform, based on the received image, object detection processing or distance detection processing of a person, a vehicle, an obstacle, a sign, a character on a road surface, or the like.

The image pickup unit 231 is an optical sensor that receives light and outputs an electric signal according to the amount of the light received. The image pickup unit 231 can output the electric signal as an image or can output the electric signal as distance measurement information. The light received by the image pickup unit 231 may be visible light or invisible light such as infrared rays. The image pickup unit 231 includes the solid-state image pickup device according to any one of the first to fourth embodiments.

The in-vehicle information detection unit 240 detects information inside the vehicle on which the vehicle control system 200 is mounted. For example, a driver condition detection unit 241 that detects the condition of a driver is connected to the in-vehicle information detection unit 240. For example, the driver condition detection unit 241 includes a camera that captures an image of the driver, and based on detection information input from the driver condition detection unit 241, the in-vehicle information detection unit 240 may calculate a degree of fatigue or concentration of the driver, or may determine whether or not the driver has fallen asleep. This camera may include the solid-state image pickup device according to any one of the first to fourth embodiments, and may be, for example, the camera 100 illustrated in FIG. 15.

The microcomputer 251 can calculate a control target value of the driving force generation device, the steering mechanism, or the braking device based on the information inside or outside the vehicle acquired by the out-vehicle information detection unit 230 or the in-vehicle information detection unit 240, and output a control command to the drive system control unit 210. For example, the microcomputer 251 can perform cooperative control for the purpose of realizing ADAS (Advanced Driver Assistance System) functions such as vehicle collision avoidance, impact mitigation, follow-up driving based on inter-vehicle distance, vehicle speed maintenance driving, collision warning, and lane deviation warning.

Further, the microcomputer 251 can perform cooperative control for the purpose of automatic driving which is autonomous travel without depending on driver's operations, by controlling the driving force generation device, the steering mechanism, or the braking device based on the information around the vehicle acquired by the out-vehicle information detection unit 230 or the in-vehicle information detection unit 240.

Further, the microcomputer 251 can output a control command to the body system control unit 220 based on the information outside the vehicle acquired by the out-vehicle information detection unit 230. For example, the microcomputer 251 can perform cooperative control for the purpose of anti-dazzle such as switching the high beam to the low beam by controlling headlamps according to the position of a preceding vehicle or an oncoming vehicle detected by the out-vehicle information detection unit 230.

The audio image output unit 252 transmits an output signal of at least one of audio and image to an output device capable of visually or audibly notifying information to a passenger of the vehicle or the outside of the vehicle. In the example of FIG. 16, an audio speaker 261, a display unit 262, and an instrument panel 263 are illustrated as such output devices. The display unit 262 may include, for example, an on-board display or a head-up display.

Figure 17:
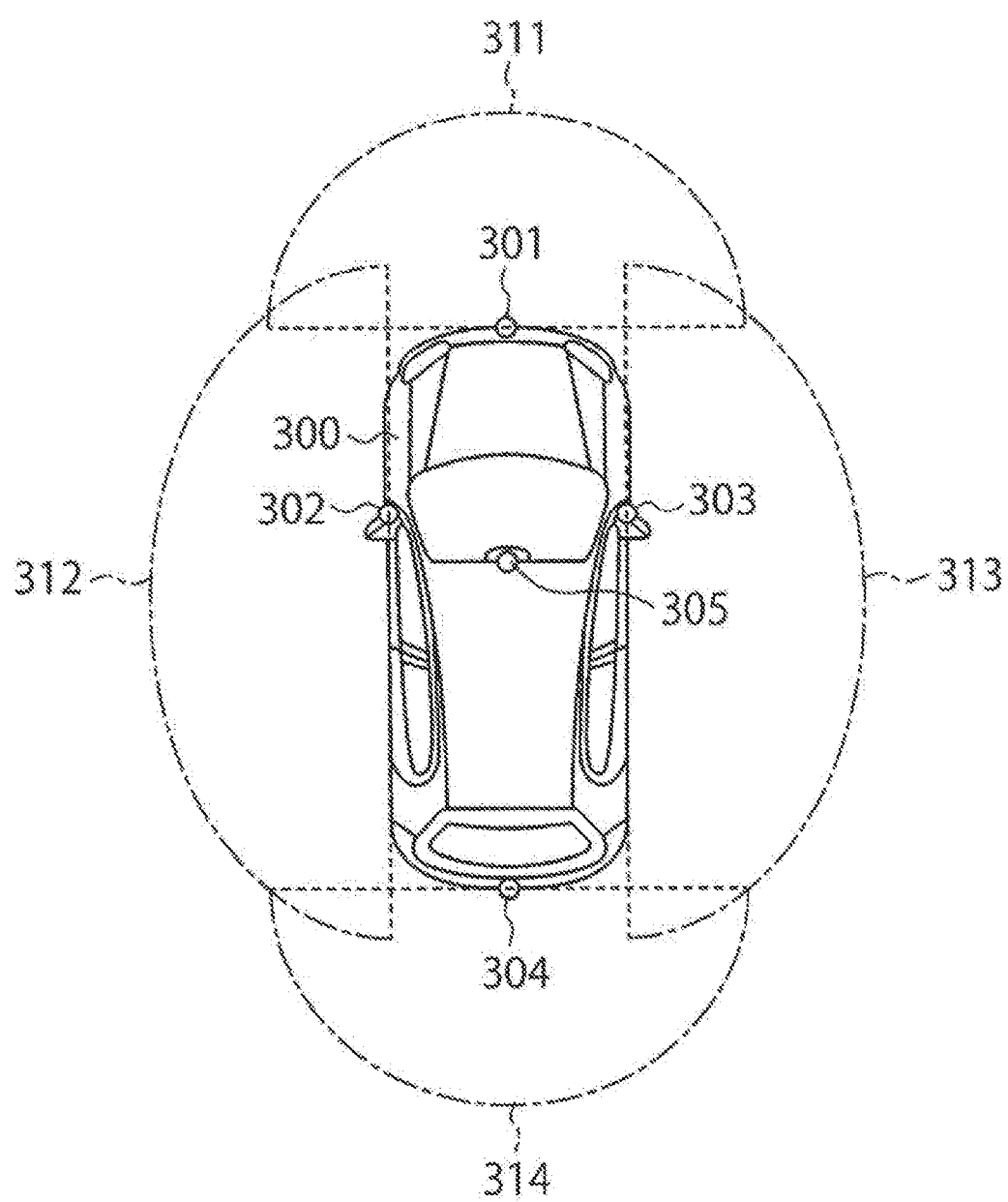
FIG. 17 is a plan view illustrating a specific example of setting positions of an image pickup unit of FIG. 16.

FIG. 17 is a plan view illustrating a specific example of setting positions of the image pickup unit 231 of FIG. 16.

A vehicle 300 illustrated in FIG. 17 includes image pickup units 301, 302, 303, 304, and 305, which each serve as the image pickup units 231. The image pickup units 301, 302, 303, 304, and 305 are provided, for example, at positions such as the front nose, side mirrors, rear bumper, and back door of the vehicle 300, and an upper part of the windshield on the vehicle inner side.

The image pickup unit 301 provided on the front nose mainly acquires an image in front of the vehicle 300. The image pickup unit 302 provided on the left side mirror and the image pickup unit 303 provided on the right side mirror mainly acquire images on the sides of the vehicle 300. The image pickup unit 304 provided on the rear bumper or the back door mainly acquires an image in rear of the vehicle 300. The image pickup unit 305 provided on the upper part of the windshield on the vehicle inner side mainly acquires an image in front of the vehicle 300. The image pickup unit 305 is used, for example, to detect a preceding vehicle, a pedestrian, an obstacle, a traffic light, a traffic sign, a lane, or the like.

FIG. 17 illustrates an example of the image capture ranges of the image pickup units 301, 302, 303, and 304 (hereinafter referred to as the "image pickup units 301 to 304"). An image capture range 311 indicates the image capture range of the image pickup unit 301 provided on the front nose. An image capture range 312 indicates the image capture range of the image pickup unit 302 provided on the left side mirror. An image capture range 313 indicates the image capture range of the image pickup unit 303 provided on the right side mirror. An image capture range 314 indicates the image capture range of the image pickup unit 304 provided on the rear bumper or the back door. A bird's-eye view image of the vehicle 300 viewed from above can be obtained, for example, by superimposing image data captured by the image pickup units 301 to 304. Hereinafter, the image capture ranges 311, 312, 313, and 314 will be referred to as the "image capture ranges 311 to 314".

At least one of the image pickup units 301 to 304 may have a function of acquiring distance information. For example, at least one of the image pickup units 301 to 304 may be a stereo camera including a plurality of image pickup devices, or may be an image pickup device having pixels for phase difference detection.

For example, the microcomputer 251 (FIG. 16) calculates, based on distance information obtained from the image pickup units 301 to 304, calculates a distance to three-dimensional objects within the image capture ranges 311 to 314 and a temporal change of this distance (a relative velocity to the vehicle 300). Based on these calculation results, the microcomputer 251 can extract, as a preceding vehicle, a three-dimensional object that is the closest three-dimensional object on the traveling path of the vehicle 300 and is also traveling at a predetermined speed (e.g., 0 km/h or more) in almost the same direction as the vehicle 300. Furthermore, the microcomputer 251 can set an inter-vehicle distance to be secured in front of a preceding vehicle in advance, and can perform automatic brake control (including follow-up stop control), automatic acceleration control (including follow-up start control), and the like. In this way, according to this example, it is possible to perform cooperative control for the purpose of automatic driving which is autonomous travel without depending on driver's operations, and the like.

For example, the microcomputer 251 can classify and extract three-dimensional object data related to a three-dimensional object into two-wheeled vehicles, ordinary vehicles, large vehicles, pedestrians, electric poles, and other three-dimensional objects based on the distance information obtained from the image pickup units 301 to 304, and use the resulting data for automatic avoidance of obstacles. For example, the microcomputer 251 distinguishes obstacles around the vehicle 300 into obstacles that can be visually recognized by the driver of the vehicle 300 and obstacles that are difficult to visually recognize. Then, the microcomputer 251 can determine a collision risk indicating the risk of collision with each obstacle, and when there is a possibility of collision that the collision risk is equal to or higher than a set value, the microcomputer 251 can provide driving support for collision avoidance by outputting a warning to the driver via the audio speaker 261 or the display unit 262 or by performing forced deceleration and avoidance steering via the drive system control unit 210.

At least one of the image pickup units 301 to 304 may be an infrared camera that detects infrared rays. For example, the microcomputer 251 can determine whether or not a pedestrian is present in the captured images from the image pickup units 301 to 304, thereby recognizing the pedestrian. Such recognition of a pedestrian is performed, for example, by a procedure for extracting feature points in the captured images from the image pickup units 301 to 304 as infrared cameras and a procedure for performing pattern matching processing on a series of feature points indicating the outline of an object to determine whether or not the object is a pedestrian. When the microcomputer 251 determines that a pedestrian is present in the captured images from the image pickup units 301 to 304 and recognizes the pedestrian, the audio image output unit 252 controls the display unit 262 to perform superimposition display of a square contour line for emphasizing the recognized pedestrian. Further, the audio image output unit 252 may control the display unit 262 to display an icon or the like indicating a pedestrian at a desired position.

Although the embodiments in the present disclosure have been described above, these embodiments may be implemented with various modifications without departing from the spirit and scope of the present disclosure. For example, two or more embodiments may be combined to be implemented.

It is to be noted that the present disclosure may also be configured as follows.

(1)

A solid-state image pickup device comprising:
a first substrate that is a substrate other than a {100} substrate;
a photoelectric conversion unit that is provided in the first substrate;
a lens that is provided above the first substrate;
one or more substrates that are provided below the first substrate and have a crystal plane different from a crystal plane of the first substrate; and
a transistor that is provided on an upper surface or a lower surface of one of the one or more substrates and is included in a source follower circuit.

(2)

The solid-state image pickup device according to (1), wherein
the first substrate includes
a vertical trench extending in a vertical direction and
a horizontal trench extending in a horizontal direction and connected to the vertical trench, and
the horizontal trench includes a light-shielding film that is provided between the photoelectric conversion unit and a charge holding unit in the first substrate.

(3)

The solid-state image pickup device according to (2), wherein the light-shielding film is provided in the horizontal trench and the vertical trench.

(4)

The solid-state image pickup device according to (3), wherein the light-shielding film is provided in the horizontal trench and the vertical trench via an element separation insulating film.

(5)

The solid-state image pickup device according to (1), wherein
the first substrate is a {111} substrate, and
the substrate provided with the transistor is a {100} substrate or a {110} substrate.

(6)

The solid-state image pickup device according to (1), further comprising a capacitor that is provided in the same layer as the transistor.

(7)

The solid-state image pickup device according to (1), further comprising a logic circuit that is provided in the same layer as the transistor.

(8)

The solid-state image pickup device according to (1), wherein the transistor is an amplification transistor electrically connected to a floating diffusion unit in the first substrate.

(9)

The solid-state image pickup device according to (1), wherein the transistor includes a gate insulating film and a gate electrode which are provided in this order on an upper surface or a lower surface of one of the one or more substrates.

(10)

The solid-state image pickup device according to (1), further comprising a transfer transistor that is provided on a lower surface of the first substrate.

(11)

The solid-state image pickup device according to (1), wherein
the one or more substrates include a second substrate that is provided below the first substrate and is provided with a capacitor on a lower surface thereof, and
the transistor is provided on the lower surface of the second substrate.

(12)

The solid-state image pickup device according to (11), wherein the one or more substrates further include a third substrate that is provided below the second substrate and is provided with a logic circuit on an upper surface thereof.

(13)

The solid-state image pickup device according to (1), wherein
the one or more substrates include a third substrate that is provided below the first substrate and is provided with a capacitor and a logic circuit on an upper surface thereof, and
the transistor is provided on the upper surface of the third substrate.

(14)

The solid-state image pickup device according to (1), wherein
the one or more substrates include a second substrate that is provided below the first substrate and is provided with a capacitor and a logic circuit on a lower surface thereof, and
the transistor is provided on the lower surface of the second substrate.

(15)

The solid-state image pickup device according to (14), wherein the one or more substrates further include a third substrate that is provided below the second substrate.

(16)

The solid-state image pickup device according to (1), wherein
the one or more substrates include the second substrate that is provided below the first substrate and is provided with a capacitor on a lower surface thereof, and
the transistor is provided on the lower surface of the second substrate.

(17)

The solid-state image pickup device according to (16), wherein the one or more substrates further include a third substrate that is provided below the second substrate.

(18)

The solid-state image pickup device according to (16), further comprising a fourth substrate that is provided above the first substrate and is provided with a logic circuit on an upper surface or a lower surface thereof.

(19)

The solid-state image pickup device according to (18), wherein the fourth substrate is provided above the first substrate via solder.

(20)

An electronic apparatus comprising an image pickup device, wherein
the image pickup device includes:
a first substrate that is a substrate other than a {100} substrate;
a photoelectric conversion unit that is provided in the first substrate;
a lens that is provided above the first substrate;
one or more substrates that are provided below the first substrate and have a crystal plane different from a crystal plane of the first substrate; and
a transistor that is provided on an upper surface or a lower surface of one of the one or more substrates and is included in a source follower circuit.

REFERENCE SIGNS LIST

1 Pixel
2 Pixel array region
3 Control circuit
4 Vertical drive circuit
5 Column signal processing circuit
6 Horizontal drive circuit
7 Output circuit
8 Vertical signal line
9 Horizontal signal line
11 Upper substrate
12 Intermediate substrate
13 Lower substrate
14 Planarization film
15 Color filter layer
16 On-chip lens
17 Stack substrate
21 Substrate
21a N-type semiconductor region
21b P+-type semiconductor region
21c P-type semiconductor region
21d N+-type semiconductor region
21e N+-type semiconductor region
21f N+-type semiconductor region
22 Insulating film 23 Gate electrode
24 Interlayer insulating film
25 Multilayer wiring structure
25a Contact plug
25b Wiring layer
25c Via plug
25d Metal pad
31 Substrate
31a, 31b, 31c, 31d, 31e, 31f Diffusion layer
32 Insulating film
33 Gate electrode
34 Interlayer insulating film
35 Multilayer wiring structure
35a Contact plug
35b Wiring layer
35c Via plug
35d Metal pad
36 Upper electrode
37 Insulating film
38 Lower electrode
41 Substrate
41a, 41b, 41c Diffusion layer
42 Insulating film
43 Gate electrode
44 Interlayer insulating film
45 Multilayer wiring structure
45a Contact plug
45b Wiring layer
45c Via plug
45d Metal pad
46 Lower electrode
47 Insulating film
48 Upper electrode
51 Trench
51a Vertical trench
51b Horizontal trench
52 Element separation insulating film
53 Light-shielding film
54, 55 Plug
56 Wiring layer
57 Plug
58 Metal pad
61 Substrate
62 Insulating film
63 Metal pad
71 Solder ball

The invention claimed is:

1. A solid-state image pickup device, comprising:
a first substrate different from a {100} substrate, wherein the first substrate includes:
a charge holding unit;
a vertical trench that extends in a vertical direction of the first substrate; and
a horizontal trench that extends in a horizontal direction of the first substrate, wherein the horizontal trench is connected to the vertical trench;
a photoelectric conversion unit in the first substrate, wherein the horizontal trench includes a light-shielding film between the photoelectric conversion unit and the charge holding unit;
a lens above the first substrate;
at least one substrate below the first substrate, wherein the at least one substrate has a crystal plane different from a crystal plane of the first substrate;
an intermediate substrate that includes a wiring layer and a second substrate of the at least one substrate, wherein the vertical trench extends in the vertical direction from an upper surface of the wiring layer through a lower surface of the first substrate; and
a transistor on one of an upper surface of the at least one substrate or a lower surface of the at least one substrate.

2. The solid-state image pickup device according to claim 1, wherein each of the horizontal trench and the vertical trench includes the light-shielding film.

3. The solid-state image pickup device according to claim 2, wherein each of the horizontal trench and the vertical trench includes an element separation insulating film and the light-shielding film.

4. The solid-state image pickup device according to claim 1, wherein
the first substrate is a {111} substrate, and
the second substrate is one of the {100} substrate or a {110} substrate.

5. The solid-state image pickup device according to claim 1, further comprising a capacitor in a layer of the solid-state image pickup device, wherein the layer is same as a layer that includes the transistor in the solid-state image pickup device.

6. The solid-state image pickup device according to claim 1, further comprising a logic circuit in a layer of the solid-state image pickup device, wherein the layer is same as a layer that includes the transistor in the solid-state image pickup device.

7. The solid-state image pickup device according to claim 1, wherein
the first substrate includes a floating diffusion unit, and
the transistor is an amplification transistor electrically connected to the floating diffusion unit in the first substrate.

8. The solid-state image pickup device according to claim 1, wherein
the transistor includes a gate insulating film and a gate electrode in an order of the gate insulating film and the gate electrode on one of the upper surface or the lower surface of the at least one substrate.

9. The solid-state image pickup device according to claim 1, further comprising a transfer transistor on the lower surface of the first substrate.

10. The solid-state image pickup device according to claim 1, wherein
the at least one substrate further includes the second substrate below the first substrate,
the second substrate includes a capacitor on a lower surface of the second substrate, and
the transistor is on the lower surface of the second substrate.

11. The solid-state image pickup device according to claim 10, wherein
the at least one substrate further includes a third substrate below the second substrate, and
the third substrate includes a logic circuit on an upper surface of the third substrate.

12. The solid-state image pickup device according to claim 1, wherein
the at least one substrate further includes a third substrate below the first substrate,
the third substrate includes a logic circuit on an upper surface of the third substrate, and
the transistor is on the upper surface of the third substrate.

13. The solid-state image pickup device according to claim 1, wherein
the at least one substrate further includes the second substrate below the first substrate, the second substrate includes a capacitor and a logic circuit on a lower surface of the second substrate, and the transistor is on the lower surface of the second substrate.

14. The solid-state image pickup device according to claim 13, wherein the at least one substrate further includes a third substrate below the second substrate.

15. The solid-state image pickup device according to claim 1, wherein the at least one substrate further includes the second substrate below the first substrate, the second substrate includes a capacitor on a lower surface of the second substrate, and the transistor is on the lower surface of the second substrate.

16. The solid-state image pickup device according to claim 15, wherein the at least one substrate further includes a third substrate below the second substrate.

17. The solid-state image pickup device according to claim 15, further comprising a fourth substrate above the first substrate, wherein the fourth substrate includes a logic circuit on one of an upper surface of the fourth substrate or a lower surface of the fourth substrate.

18. The solid-state image pickup device according to claim 17, wherein the fourth substrate is above the first substrate via solder.

19. An electronic apparatus, comprising:
an image pickup device that includes:
a first substrate different from a {100} substrate, wherein the first substrate includes:
a charge holding unit;
a vertical trench that extends in a vertical direction of the first substrate; and
a horizontal trench that extends in a horizontal direction of the first substrate, wherein the horizontal trench is connected to the vertical trench;
a photoelectric conversion unit in the first substrate, wherein the horizontal trench includes a light-shielding film between the photoelectric conversion unit and the charge holding unit;
a lens above the first substrate;
at least one substrate below the first substrate, wherein the at least one substrate has a crystal plane different from a crystal plane of the first substrate;
an intermediate substrate that includes a wiring layer and a second substrate of the at least one substrate, wherein
the vertical trench extends in the vertical direction from an upper surface of the wiring layer through a lower surface of the first substrate; and
a transistor on one of an upper surface of the at least one substrate or a lower surface of the at least one substrate.

20. The solid-state image pickup device according to claim 1, wherein the vertical trench extends in the vertical direction from the upper surface of the wiring layer of the intermediate substrate through the second substrate and the lower surface of the first substrate.

* * * * *